US009553042B2

(12) United States Patent
Kuwajima

(10) Patent No.: US 9,553,042 B2
(45) Date of Patent: Jan. 24, 2017

(54) SEMICONDUCTOR DEVICE AND MANUFACTURING METHOD THEREFOR

(71) Applicant: Renesas Electronics Corporation, Tokyo (JP)

(72) Inventor: Teruhiro Kuwajima, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/832,397

(22) Filed: Aug. 21, 2015

(65) Prior Publication Data

US 2016/0056107 A1 Feb. 25, 2016

(30) Foreign Application Priority Data

Aug. 25, 2014 (JP) ................. 2014-170587

(51) Int. Cl.
| | | |
|---|---|---|
| H01L 23/52 | (2006.01) | |
| H01L 23/522 | (2006.01) | |
| H01L 21/768 | (2006.01) | |
| H01L 21/311 | (2006.01) | |

(52) U.S. Cl.
CPC ..... H01L 23/5223 (2013.01); H01L 21/76808 (2013.01); H01L 21/31144 (2013.01); H01L 21/76834 (2013.01); H01L 2924/0002 (2013.01)

(58) Field of Classification Search
None
See application file for complete search history.

(56) References Cited

U.S. PATENT DOCUMENTS

| | | | | |
|---|---|---|---|---|
| 5,710,462 A | * | 1/1998 | Mizushima | ......... H01L 23/5226 257/637 |
| 6,982,200 B2 | | 1/2006 | Noguchi et al. | |
| 9,437,556 B2 | * | 9/2016 | Ishiguro | ................ H01L 23/585 |
| 2003/0062564 A1 | * | 4/2003 | Kobayashi | .......... H01L 23/5223 257/306 |
| 2003/0183940 A1 | * | 10/2003 | Noguchi | ........... H01L 21/76801 257/767 |
| 2010/0032741 A1 | * | 2/2010 | Ueno | ................ H01L 21/28273 257/298 |

(Continued)

FOREIGN PATENT DOCUMENTS

| | | |
|---|---|---|
| JP | 2004-128466 A | 4/2004 |
| JP | 2004-214550 A | 7/2004 |
| JP | 2005-109063 A | 4/2005 |

*Primary Examiner* — Michael Lebentritt
(74) *Attorney, Agent, or Firm* — Mattingly & Malur, PC

(57) ABSTRACT

A wiring structure thereof includes a first interlayer insulating film, a first wiring and a first electrode for the capacitive element embedded in the first interlayer insulating film, a barrier insulating film formed over the first interlayer insulating film to cover the wiring and the electrode, a second interlayer insulating film formed over the barrier insulating film, and a second wiring and a second electrode for the capacitive element embedded in the second interlayer insulating film. The lower surface of the second wiring is positioned in the middle of the thickness of the second interlayer layer film, and the lower surface of the second electrode is in contact with the barrier insulating film. The barrier insulating film of a portion interposed between both electrodes functions as a capacitance insulating film of the capacitive element and is thicker than the barrier insulating film of a portion covering the first wiring.

9 Claims, 23 Drawing Sheets

(56) References Cited

U.S. PATENT DOCUMENTS

| | | | |
|---|---|---|---|
| 2010/0052062 A1* | 3/2010 | Fukui | H01L 21/76801 257/368 |
| 2011/0018096 A1* | 1/2011 | Izumi | H01L 23/5223 257/532 |
| 2011/0133311 A1* | 6/2011 | Watanabe | H01L 21/76808 257/532 |
| 2012/0193760 A1* | 8/2012 | Manabe | H01L 27/10814 257/532 |
| 2014/0138848 A1* | 5/2014 | Matsuura | H01L 23/481 257/774 |
| 2015/0145009 A1* | 5/2015 | Namioka | H01L 27/10814 257/296 |
| 2015/0357400 A1* | 12/2015 | Furuhashi | H01L 23/53219 257/533 |

* cited by examiner

SEMICONDUCTOR DEVICE AND MANUFACTURING METHOD THEREFOR

CROSS-REFERENCE TO RELATED APPLICATIONS

The disclosure of Japanese Patent Application No. 2014-170587 filed on Aug. 25, 2014 including the specification, drawings and abstract is incorporated herein by reference in its entirety.

BACKGROUND

The present invention relates to a semiconductor device and a manufacturing method therefor, and is available suitably in, for example, a semiconductor device having a capacitive element and a manufacturing method therefor.

Various semiconductor devices are manufactured by forming a MISFET (Metal Insulator Semiconductor Field Effect Transistor), a capacitive element and the like over a semiconductor substrate and coupling among the respective elements by wirings. As the capacitive element formed over the semiconductor substrate, there may be mentioned a MIM (Metal Insulator Metal) type capacitive element.

There has been described in each of Japanese Unexamined Patent Application Publication No. 2005-109063 (Patent Document 1), Japanese Unexamined Patent Application Publication No. 2004-214550 (Patent Document 2), and Japanese Unexamined Patent Application Publication No. 2004-128466 (Patent Document 3), a technique related to the MIM type capacitive element.

RELATED ART DOCUMENTS

Patent Documents

[Patent Document 1] Japanese Unexamined Patent Application Publication No. 2005-109063
[Patent Document 2] Japanese Unexamined Patent Application Publication No. 2004-214550
[Patent Document 3] Japanese Unexamined Patent Application Publication No. 2004-128466

SUMMARY

There is a demand for an improvement in the reliability as much as possible even in a semiconductor device having a capacitive element. Alternatively, it is hoped to improve the performance as much as possible. Or it is hoped to improve the reliability and enhance the performance.

Other problems and novel features will be apparent from the description of the present specification and the accompanying drawings.

According to one aspect of the present invention, there is provided a wiring structure of a semiconductor device, which includes a first interlayer insulating film; a first wiring, and a first electrode for a capacitive element both of which are embedded in the first interlayer insulating film, a barrier insulating film formed over the first interlayer insulating film so as to cover the first wiring and the first electrode; a second interlayer insulating film formed over the barrier insulating film; and a second wiring, and a second electrode for the capacitive element both of which are embedded in the second interlayer insulating film. A lower surface of the second wiring is positioned in the middle of the thickness of the second interlayer insulating film. A lower surface of the second electrode is in contact with the barrier insulating film. Further, the barrier insulating film of a portion interposed between the first electrode and the second electrode functions as a capacitance insulating film of the capacitive element and is thicker than the barrier insulating film of a portion which covers the first wiring.

According to another aspect of the present invention, there is provided a method for manufacturing a semiconductor device, which comprises the steps of (a) forming above a semiconductor substrate, a first interlayer insulating film embedded with a first wiring and a first electrode for a capacitive element, (b) forming over the first interlayer insulating film, a barrier insulating film having a thin film part and a thick film part thicker than the thin film part so as to cover the first wiring and the first electrode, and (c) forming a second interlayer insulating film over the barrier insulating film. The method further includes the steps of (d) forming an opening and a hole for exposing the barrier insulating film in the second interlayer insulating film, (e) forming a trench in the second interlayer insulating film, and (f) removing the barrier insulating film at the bottom of the hole to expose a part of the first wiring from the hole. Furthermore, the method includes the step of (g) forming a second electrode for the capacitive element in the opening and forming a second wiring in the trench and the hole. In the (b) step, the first wiring is covered with the thin film part of the barrier insulating film, and at least a part of the first electrode is covered with the thick film part of the barrier insulating film. In the (d) step, the thick film part of the barrier insulating film is exposed at the bottom of the opening, and the thin film part of the barrier insulating film is exposed at the bottom of the hole. Further, the trench is provided to internally include the hole in plan view and position the bottom of the hole in the middle of the thickness of the second interlayer insulating film. The thick film part of the barrier insulating film is interposed between the first electrode and the second electrode. The barrier insulating film of a portion interposed between the first electrode and the second electrode functions as a capacitance insulating film of the capacitive element.

According to the above aspect, it is possible to improve the reliability of the semiconductor device.

Alternatively, it is possible to enhance the performance of the semiconductor device.

Or it is possible to improve the reliability of the semiconductor device and enhance the performance thereof.

DETAILED DESCRIPTION

Figure 1:
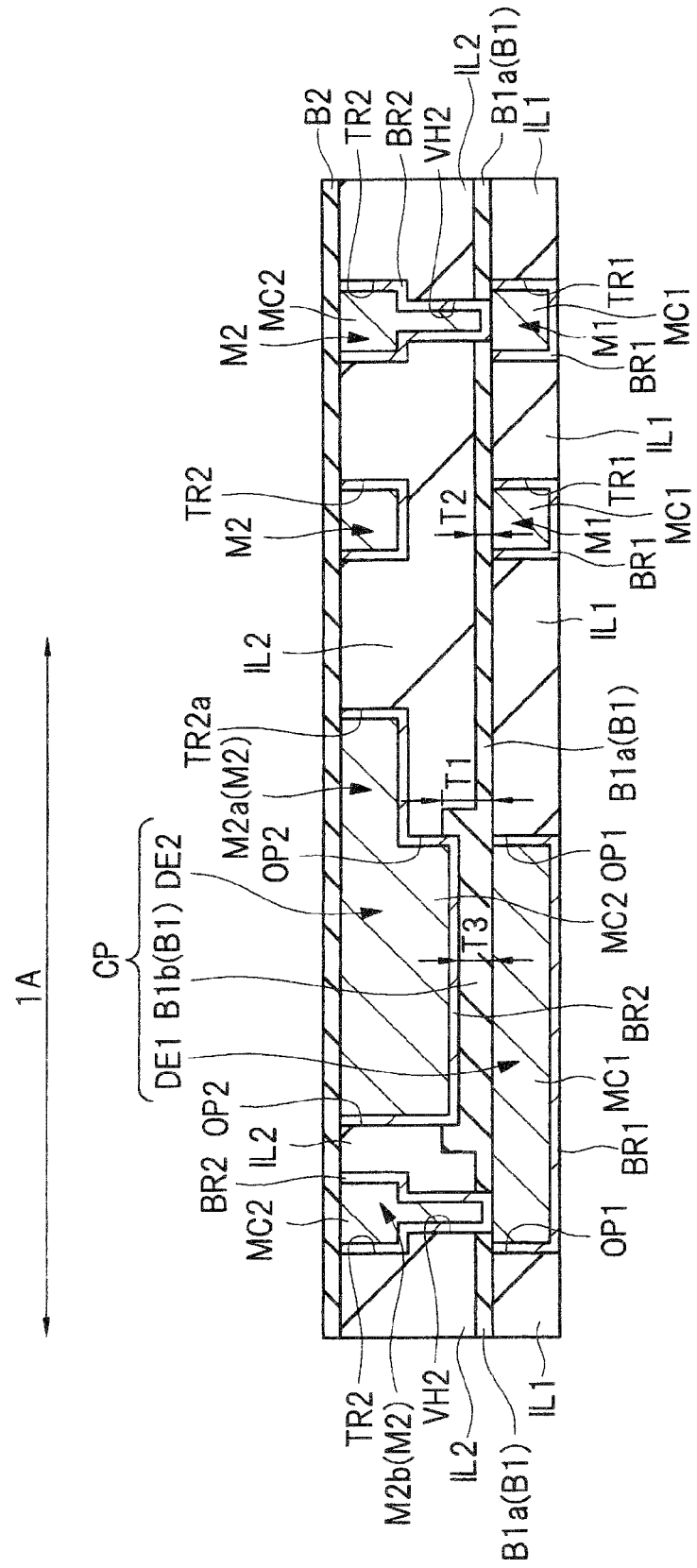
FIG. 1 is a fragmentary sectional diagram of a semiconductor device according to one embodiment.

The invention will be described by being divided into a plurality of sections or embodiments whenever circumstances require it for convenience in the following embodiments. However, unless otherwise specified in particular, they are not irrelevant to one another. One thereof has to do with modifications, details, supplementary explanations, etc. of some or all of the other. Also, when reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle. It is further needless to say that in the following embodiments, components (also including element or factor steps, etc.) employed therein are not always essential unless otherwise specified in particular and considered to be definitely essential in principle. Similarly, when reference is made to the shapes, positional relations and the like of the components or the like in the following embodiments, they will include ones substantially analogous or similar to their shapes or the like except for where otherwise specified in particular and considered not to be definitely so in principle, etc. This is similarly applied even to the above-described numerical values and range.

Embodiments will be described below in detail on the basis of the accompanying drawings. Incidentally, in all of the drawings for describing the embodiments, the same reference numerals are respectively attached to components having the same function, and their repetitive description will be omitted. Further, in the following embodiments, the description of the same or like parts will not be repeated in principle except for where necessary in particular.

Further, in the drawings used in the embodiments, hatching may be omitted to make it easy to see the drawings even in sectional diagrams. Further, hatching may be applied to make it easy to see the drawings even in plan diagrams.

Embodiment 1

Structure of Semiconductor Device

A semiconductor device according to the present embodiment will be described with reference to the accompanying drawings. The semiconductor device according to the present embodiment is a semiconductor device having a capacitive element.

Figure 2:
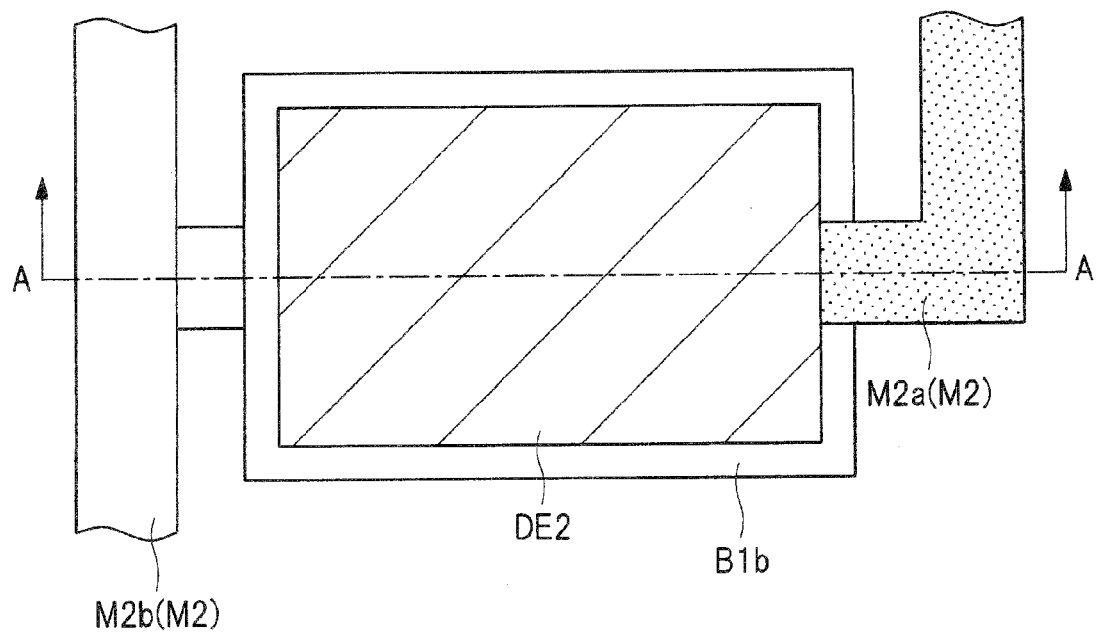
FIG. 2 is a fragmentary plan diagram of the semiconductor device according to the one embodiment.
Figure 3:
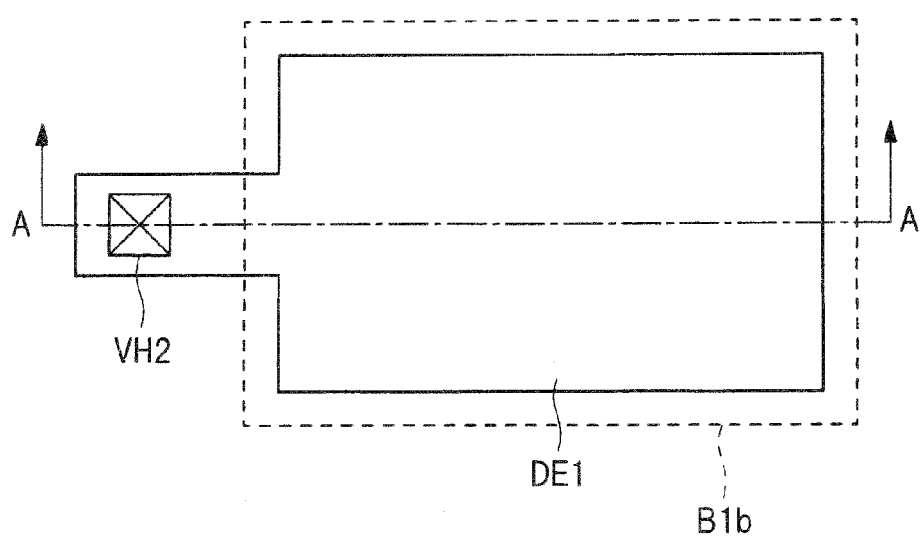
FIG. 3 is a fragmentary plan diagram of the semiconductor device according to the one embodiment.

FIG. 1 is a fragmentary sectional diagram of the semiconductor device according to the present embodiment. FIGS. 2 and 3 are fragmentary plan diagrams of the semiconductor device according to the present embodiment.

In FIG. 1, for simplification of the drawing, the illustration of a structure of a layer lower than a wiring layer formed with each wiring M1 and an electrode DE1 is omitted, and the illustration of a structure of an upper layer than a barrier insulating film B2 is also omitted. Further, FIGS. 2 and 3 respectively show the same plane area (plane area in which a capacitive element CP is formed). FIG. 3 corresponds to the case where an electrode DE2, a wiring M2, a thick film part B1b of a barrier insulating film B1 are omitted from FIG. 2. In FIG. 3, however, the thick film part B1b of the barrier insulating film B1 is indicated by a dotted line, and the position of a via hole VH2 for a wiring M2b coupled to the electrode DE1 is also shown. Further, a cross-section shown in a capacitor area 1A of FIG. 1 substantially corresponds to a cross-section at a position taken along line A-A of each of FIGS. 2 and 3.

The semiconductor device according to the present embodiment is a semiconductor device in which a wiring structure (multilayer wiring structure) having a plurality of wiring layers is formed over a semiconductor substrate (semiconductor substrate SB to be described later). A capacitive element CP of a MIM (Metal Insulator Metal) type is formed in the wiring structure.

In the present embodiment, although details will be mentioned later, the barrier insulating film (B1) for covering the wiring (M1) is used even as capacitance insulation of the MIM type capacitive element (CP). The thickness of the barrier insulating film (B1) between the electrodes (DE1 and DE2) of the capacitive element (CP) is made thicker than that of the barrier insulating film (B1) of a portion which covers the wiring (M1).

The present embodiment will be specifically described below with reference to FIGS. 1 to 3.

The semiconductor device according to the present embodiment has a semiconductor substrate (corresponding to the semiconductor substrate SB to be described later), and a wiring structure formed over the semiconductor substrate (SB) and including a plurality of wiring layers. The wiring structure includes an interlayer insulating film IL1, each wiring M1 and an electrode DE1 embedded in the interlayer insulating film IL1, a barrier insulating film B1 formed over the interlayer insulating film IL1 so as to cover the wiring M1 and the electrode DE1, an interlayer insulating film IL2 formed over the barrier insulating film B1, and each wiring M2 and an electrode D2 embedded in the interlayer insulating film IL2.

That is, the semiconductor device according to the present embodiment has the interlayer insulating film IL1 formed above the semiconductor substrate SB, each wiring M1 and the electrode DE1 embedded in the interlayer insulating film. IL1, the barrier insulating film B1 formed over the interlayer insulating film IL1 so as to cover each wiring M1 and the electrode DE1, the interlayer insulating film IL2 formed over the barrier insulating film B1, and each wiring M2 and the electrode DE2 embedded in the interlayer insulating film IL2.

Further, a barrier insulating film B2 is formed over the interlayer insulating film IL2 so as to cover each wiring M2 and the electrode DE2. Although interlayer insulating films, wirings, etc. can be formed over the barrier insulating film B2, the illustrations and explanations thereof will be omitted herein.

The wiring M1 is a wiring of an arbitrary wiring layer of the wiring layers which configure the wiring structure. The wiring M2 is a wiring of a wiring layer higher one than the wiring layer formed with the wiring M1.

At least one wiring M1 is embedded in the interlayer insulating film IL1. A plurality of wirings M1 are actually embedded therein. Further, at least one wiring M2 is embedded in the interlayer insulating film IL2. A plurality of wirings M2 are actually embedded therein.

The wiring M1 is a damascene wiring (damascene embedded wiring) which is embedded in a wiring trench TR1 formed in the interlayer insulating film IL1 and formed by a damascene method. Also, the wiring M2 is a damascene wiring (damascene embedded wiring) which is embedded in a wiring trench TR2 formed in the interlayer insulating film IL2 and formed by the damascene method. Further, the wirings M1 and M2 are both copper wirings with copper as a main constituent (main component). Accordingly, the wirings M1 and M2 are both damascene wirings (damascene copper wiring, embedded copper wiring) with copper as main constituent (main component).

The wiring M2 is a dual damascene wiring formed by a dual damascene method. Further, in the case of FIG. 1, the wiring M1 indicates a wiring of a wiring layer corresponding to a first layer (bottom layer) in the wiring structure. Though the wiring M1 is a single damascene wiring formed by a single damascene method, the wiring M1 may be a wiring of a wiring layer higher than the wiring layer corresponding to the first layer in the wiring structure. Alternatively, the wiring M1 may be a dual damascene wiring formed by a dual damascene method.

The electrode DE1 is embedded in an opening OP1 formed in the interlayer insulating film IL1 and formed by the damascene method. Further, the electrode DE2 is embedded in an opening OP2 formed in the interlayer insulating film IL2 and formed by the damascene method.

The electrode DE1 and the wiring M1 are formed in the same process. That is, the electrode DE1 is formed by the damascene method in the same process as the wiring M1. Further, the electrode DE2 and the wiring M2 are formed in the same process. That is, the electrode DE2 is formed by the damascene method in the same process as the wiring M2.

Therefore, since the electrode DE1 and the wiring M1 are formed using the same (common) conductive film, not only the wiring M1 but also the electrode DE1 is formed with copper (Cu) as a main constituent (main component). Further, since the electrode DE2 and the wiring M2 are formed using the same (common) conductive film, not only the wiring M2 but also the electrode DE2 is formed with copper (Cu) as a main constituent (main component).

The barrier insulating film B1 functions as a barrier insulating film for a copper wiring (wiring M1 herein). That is, the barrier insulating film B1 functions as a barrier insulating film for suppressing or preventing copper (Cu) in the copper wiring (wiring M1 herein) from being diffused in the interlayer insulating film IL2. Further, since the barrier insulating film B1 also covers the electrode DE1, it is capable of having even a function for suppressing or preventing copper (Cu) in the electrode DE1 from being diffused in the interlayer insulating film IL2. Therefore, the barrier insulating film B1 may preferably use a material film (high in terms of the function for suppressing or preventing the diffusion of copper) excellent in barrier properties for copper (Cu). Further, since the barrier insulating film B1 can also function as an etching stopper in an etching step for forming each via hole VH2 in the interlayer insulating film IL2. Therefore, as the barrier insulating film B1, a silicon nitride (SiN) film, a silicon carbide (SiC) film or a silicon carbonitride (SiCN) film can preferably be used.

Further, as the interlayer insulating films IL1 and IL2, a silicon oxide film or a low dielectric constant insulating film can preferably be used. Incidentally, the low dielectric constant insulating film means an insulating film lower in dielectric constant (relative dielectric constant) than silicon oxide.

The dielectric constant of the interlayer insulating film IL2 is lower than that of the barrier insulating film B1. In other words, the dielectric constant of the barrier insulating film B1 is higher than that of the interlayer insulating film IL2. Lowering the dielectric constant of the interlayer insulating film IL2 than that of the barrier insulating film B1 enables the parasitic capacitance between the adjacent wirings M2 to be reduced. Further, it is possible to reduce the parasitic capacitance between the wiring M2 and the wiring M1.

That is, as the material for the barrier insulating film B1, a material suitable for the function (e.g., diffusion prevention of copper) of the barrier insulating film is selected. On the other hand, as the material for the interlayer insulating film IL2, a material low in dielectric constant is selected to reduce the parasitic capacitance between the wirings. Consequently, it is possible to improve the reliability and performance of a wiring structure, in other words, a semiconductor device having the wiring structure.

Further, the dielectric constant of the interlayer insulating film IL1 is lower than that of the barrier insulating film B1. Lowering the dielectric constant of the interlayer insulating film IL1 enables the parasitic capacitance between the adjacent wirings M1 to be reduced.

The barrier insulating film B2 functions as a barrier insulating film for a copper wiring (wiring M2 herein). That is, the barrier insulating film B2 functions as a barrier insulating film for suppressing or preventing copper (Cu) in a copper wiring (wiring M2 herein) from being diffused into an interlayer insulating film (not shown) formed over the barrier insulating film B2. Further, since the barrier insulating film B2 also covers the electrode DE2, it is capable of having even a function for suppressing or preventing copper (Cu) in the electrode DE2 from being diffused in the interlayer insulating film (not shown) formed over the barrier insulating film B2. Therefore, the barrier insulating film B2 can be formed of a material similar to the barrier insulating film B1. Preferably, the silicon nitride (SiN) film, the silicon carbide (SiC) film or the silicon carbonitride (SiCN) film can be used therefor.

Each of the wiring M1 and the electrode DE1 is formed by a barrier conductor film BR1 formed over the inner surfaces (bottom face and sidewalls) of the wiring trench TR1 or the opening OP1, and a main conductor film MC1 formed over the barrier conductor film BR1 to fill up the wiring trench TR1 or the opening OP1. The barrier conductor film BR1 is comprised of, for example, a tantalum film, a tantalum nitride film or a laminated film of these. Further, the main conductor film MC1 is a conductive film principally comprised of copper (Cu), e.g., a copper (Cu) film. The barrier conductor film BR1 functions as a barrier conductor film for suppressing or preventing copper (Cu) in the main conductor film MC1 from being diffused in the interlayer insulating film IL1. Further, the barrier conductor film BR1 also has the function of improving adhesion between the wiring M1 and the electrode DE1, and the interlayer insulating film IL1.

Each of the wiring M2 and the electrode DE2 is formed by a barrier conductor film BR2 formed over the inner surfaces (bottom face and sidewalls) of the wiring trench TR2 or the opening OP2, and a main conductor film MC2 formed over the barrier conductor film BR2 to fill up the wiring trench TR2 or the opening OP2. The barrier conductor film BR2 is comprised of, for example, a tantalum film, a tantalum nitride film or a laminated film of these. Further, the main conductor film MC2 is a conductive film principally comprised of copper (Cu), e.g., a copper (Cu) film. The barrier conductor film BR2 functions as a barrier conductor film for suppressing or preventing copper (Cu) in the main conductor film MC2 from being diffused in the interlayer insulating film IL2. Further, the barrier conductor film BR2 also has the function of improving adhesion between the wiring M2 and the electrode DE2, and the interlayer insulating film IL2.

A lower surface of the wiring M2 is positioned in the middle of the thickness of the interlayer insulating film IL2. That is, the wiring M2 is embedded in the wiring trench TR2 formed in the interlayer insulating film IL2, but the bottom face (except for the via hole VH2) of the wiring trench TR2 is positioned in the middle of the thickness of the interlayer insulating film IL2. That is, the via hole VH2 penetrates the interlayer insulating film IL2 and the barrier insulating film B1, but the wiring trench TR2 does not penetrate the interlayer insulating film IL2. The bottom face of the wiring trench TR2 is positioned in the middle of the thickness of the interlayer insulating film IL2. Therefore, part of the interlayer insulating film IL2 (part of its thickness) is interposed between the lower surface of the wiring M2 and the upper surface of the barrier insulating film B1 except for a via portion (portion to fill up the via hole VH2) of the wiring M2.

The wiring M2 is electrically coupled to the wiring M1 through the via portion (portion to fill up the via hole VH2) of the wiring M2. The via portion of the wiring M2 corresponds to the portion to fill up the via hole VH2, in the wiring M2. The via hole (hole part) VH2 is formed so as to be internally included in the wiring trench TR2 in plan view. The via hole VH2 penetrates the interlayer insulating film IL2 and the barrier insulating film B1, and hence the upper surface of the wiring M1 is exposed at the bottom of the via hole VH2. Therefore, the wiring M2 is embedded in the wiring trench TR2, but the via portion of the wiring M2 is embedded in the via hole VH2. Since the wiring M2 is the dual damascene wiring, the via portion (portion to fill up the via hole VH2) of the wiring M2 is formed integrally with the wiring M2 (wiring M2 embedded in the wiring trench TR2). The via portion of the wiring M2 is electrically coupled to the wiring M1 in contact with the upper surface of the wiring M1. Thus, it is possible to electrically couple the wiring M2 to the wiring M1 through the via portion of the wiring M2.

Incidentally, the electrode DE1 is exposed at the bottom of the via hole VH2 in which the via portion of the wiring M2b in the wiring M2 is embedded. Consequently, the via portion of the wiring M2b is electrically coupled to the electrode DE1 in contact therewith. Therefore, the wiring M2b is electrically coupled to the electrode DE1 through the via portion of the wiring M2b.

A lower surface of the electrode DE2 is in contact with the barrier insulating film B1. That is, the electrode DE2 is embedded in the opening OP2 formed in the interlayer insulating film IL2, but the opening OP2 penetrates the interlayer insulating film IL2 to reach the barrier insulating film B1, and the barrier insulating film B1 is exposed at the bottom of the opening OP2. Therefore, the lower surface of the electrode DE2 is in contact with the barrier insulating film B1 exposed at the bottom of the opening OP2.

Thus, the electrode DE1 and the electrode DE2 have portions opposite to each other through the barrier insulating film B1 interposed therebetween without interposing the interlayer insulating film IL2 therebetween. That is, the electrode DE1 and the electrode DE2 are superimposed on each other with the barrier insulating film B1 interposed therebetween in plan view.

However, the entire electrode DE1 may be opposed to the electrode DE2 with the barrier insulating film B1 interposed therebetween, but the electrode DE1 can also have a portion opposite to the electrode DE2 with the barrier insulating film B1 interposed therebetween and a portion not opposite to the electrode DE2. Further, the entire electrode DE2 may be opposed to the electrode DE1 with the barrier insulating film B1 interposed therebetween, but the electrode DE2 can also have a portion opposite to the electrode DE1 with the barrier insulating film B1 interposed therebetween, and a portion not opposite to the electrode DE1.

The capacitive element CP is formed by the electrode DE1, the electrode DE2, and the barrier insulting film B1 interposed between the electrode DE1 and the electrode DE2. That is, the electrode DE1 functions as a lower electrode (first electrode) of the capacitive element CP, and the electrode DE2 functions as an upper electrode (second electrode) of the capacitive element CP. Further, the barrier insulating film B1 of the portion interposed between the electrode DE1 and the electrode DE2 functions as a capacitance insulating film (dielectric film) of the capacitive element CP.

Therefore, the barrier insulating film B1 can functions as a barrier insulating film for the wiring M1 and functions as a capacitance insulating film (dielectric film) for the capacitive element CP. That is, the barrier insulating film B1 of the portion positioned over the wiring M1 can function as a barrier insulating film for suppressing or preventing copper (Cu) in the wiring M1 from being diffused in the interlayer insulating film IL2. Further, the barrier insulating film B1 of the portion interposed between the electrode DE1 and the electrode DE2 functions as a capacitance insulating film (dielectric film) for the capacitive element CP. Accordingly, the same (common) insulating film (barrier insulating film B1 herein) is used as the barrier insulating film for the wiring M1 (copper wiring) and the capacitive insulating film for the capacitive element CP.

In the preset embodiment, the barrier insulating film B1 of the portion interposed between the electrode DE1 and the electrode DE2 is thicker than the barrier insulating film B1 of the portion which covers the wiring M1. In other words, the barrier insulating film B1 of the portion which covers the wiring M1 is thinner than the barrier insulating film B1 of the portion interposed between the electrode DE1 and the electrode DE2. That is, the thickness (film thickness) T3 of the barrier insulating film B1 of the portion interposed between the electrode DE1 and the electrode DE2 is larger than the thickness T2 of the barrier insulating film B1 of the portion which covers the wring M1 (T3>T2). In other words, the thickness T2 of the barrier insulating film B1 of the portion which covers the wiring M1 is smaller than the thickness (film thickness) T3 of the barrier insulating film B1 of the portion interposed between the electrode DE1 and the electrode DE2 (T3>T2)

Here, the barrier insulating film B1 is not a film having a uniform thickness. Specifically, the barrier insulating film B1 has a thin film part B1a and a thick film part B1b thicker than the thin film part B1a. Further, the thick film part B1b of the barrier insulating film B1 is interposed between the electrode DE1 and the electrode DE2. On the other hand, the thin film part B1a of the barrier insulating film B1 is formed over the wiring M1. The thin film part B1a of the barrier insulating film B1 has a substantially uniform thickness, and the thickness thereof corresponds to the thickness T2.

The opening OP2 and the electrode DE2 embedded in the opening OP2 are internally included in the thick film part B1b of the barrier insulating film B1 in plan view. Thus, the lower surface of the electrode DE2 is internally included in the thick film part B1b of the barrier insulating film B1 in plan view and comes in contact with the thick film part B1b of the barrier insulating film B1. That is, since the lower surface of the electrode DE2 comes entirely in contact with the thick film part B1b of the barrier insulating film B1, it does not contact the thin film part B1a of the barrier insulating film B1. Thus, it is possible to prevent the electrode DE2 from being formed over the thin film part B1a of the barrier insulating film B1. Consequently, the electrode DE1 and the electrode DE2 can be prevented from being opposed to each other through the thin film part B1a of the barrier insulating film B1. Accordingly, it is possible to prevent a breakdown voltage between the electrodes DE1 and DE2 from being reduced due to the electrodes DE1 and DE2 being opposed to each other through the thin film part B1a of the barrier insulating film B1.

For example, the planar shape of the electrode DE2 can be taken to be a rectangular shape. In that case, the planar shape of the thick film part B1b of the barrier insulating film B1 can also be made to a rectangular shape slightly larger than the rectangle which configures the planar shape of the electrode DE2.

The thickness (i.e., the thickness T3 of the barrier insulating film B1 of the portion interposed between the electrode DE1 and the electrode DE2) of the thick film part B1b of the portion being in contact with the lower surface of the electrode DE2, of the thick film part B1b of the barrier insulating film B1 is smaller than the thickness T1 of the thick film part B1b of a portion which does not contact the lower surface of the electrode DE2 (i.e., T3<T1).

Of the upper surface of the electrode DE1, the portion opposed to the lower surface of the electrode DE2 through the barrier insulating film B1 without via the interlayer insulating film IL2 needs to be covered with the thick film part B1b of the barrier insulating film B1. Thus, the electrode DE1 and the electrode DE2 can be opposed to each other through the thick film part B1b of the barrier insulating film B1. Therefore, the portion of the upper surface of the electrode DE1, which is superimposed on the electrode DE2 in plan view is configured so as to be covered with the thick film part B1b of the barrier insulating film B1. On the other hand, the portion of the upper surface of the electrode DE1, which does not overlap with the electrode DE2 in plan view may be covered with the thick film part B1b of the barrier insulating film B1 or may be covered with the thin film part B1a of the barrier insulating film B1. Incidentally, the wiring M2b electrically coupled to the electrode DE1 is disposed at a position where it does not overlap with the electrode DE2 in plan view. Of the upper surface of the electrode DE1, the area in which the via portion of the wiring M2b is coupled to the electrode DE1, and its neighborhood are covered with the thin film part B1a of the barrier insulating film B1. The via portion of the wiring M2b penetrates the thin film part B1a of the barrier insulating film B1 so as to be coupled to the electrode DE1.

Further, the wiring M2 can also be formed integrally with the electrode DE2. In the case of FIGS. 1 and 2, the wiring M2a of the wiring M2 is formed integrally with the electrode DE2.

The wiring M2a is a damascene wiring (damascene copper wiring, embedded copper wiring) which is embedded in a wiring trench TR2a formed in the interlayer insulating film IL2 as with the wiring M2 by the damascene method and comprised of copper as a main constituent (main component). The wiring trench TR2a in which the wiring M2a is embedded is formed in the same process as the wiring trench TR2. The wiring trench TR2a has a depth similar to the wiring trench TR2 and is positioned in the middle of the thickness of the interlayer insulating film IL2. That is, the wiring trench TR2a does not penetrate the interlayer insulating film IL2 either as with the wiring trench TR2. The bottom face of the wiring trench TR2a is positioned in the middle of the thickness of the interlayer insulating film IL2. However, the wiring trench TR2a is coupled to the opening OP2. Therefore, the electrode DE2 and the wiring M2a are formed integrally in the same process.

The width of the wiring M2a can be made smaller than that of the electrode DE2. Further, it is also possible that the wiring M2a is not be formed. When the wiring M2a is not formed, the electrode DE2 may be coupled to a wiring higher than the electrode DE2 or a wiring lower than the electrode DE2. For example, a wiring (not shown) of a wiring layer higher one than the wiring layer in which the electrode DE2 and the wiring M2 are formed is disposed over the electrode DE2, and a via portion of the wiring can be electrically coupled to the upper surface of the electrode DE2 in contact therewith. Thus, the electrode DE2 can be electrically coupled to the wiring (not shown) of the wiring layer higher one than the wiring layer in which the electrode DE2 and the wiring M2 are formed.

Since the opening OP2 embedded with the electrode DE2 penetrates the interlayer insulating film IL2 and thereby reaches the barrier insulating film B1 (more particularly, the thick film part B1b of the barrier insulating film B1), the lower surface of the electrode DE2 embedded in the opening OP2 is in contact with the barrier insulating film B1 (more particularly, the thick film part B1b of the barrier insulating film B1). On the other hand, since the wiring trench TR2 embedded with the wiring M2a does not penetrate the interlayer insulating film IL2, the lower surface of the wiring M2a is positioned in the middle of the thickness of the interlayer insulating film IL2, and part of the interlayer insulating film IL2 (part of its thickness) is interposed between the lower surface of the wiring M2a and the upper surface of the barrier insulating film B1.

Incidentally, in the plan diagram of FIG. 2, an area to which slash hatching is applied corresponds to the electrode DE2 and corresponds to an area in which the electrode DE2 penetrated through the interlayer insulating film IL2 and being in contact with the barrier insulating film B1 (more particularly, the thick film part B1b of the barrier insulating film B1) is formed. Further, in the plan diagram of FIG. 2, an area in which hatching of dots is applied corresponds to the wiring M2a. In this area, the lower surface of the wiring M2a is not in contact with the barrier insulating film B1, and part of the interlayer insulating film IL2 (part of its thickness) is interposed between the wiring M2a and the barrier insulating film B1.

Further, the electrode DE1 which functions as the lower electrode of the capacitive element CP is covered with the barrier insulating film B1 over its entire upper surface. In the case of FIGS. 1 to 3, the wiring M2b of the wiring M2 is electrically coupled to the electrode DE1. When the via portion (portion to fill up the via hole VH2) of the wiring M2b is coupled to the upper surface of the electrode DE1, the via portion (portion to fill up the via hole VH2) of the wiring M2b penetrates the barrier insulating film B1 and is coupled to the upper surface of the electrode DE1. Here, the thin film part B1a of the barrier insulating film B1 is formed over part of the electrode DE1. The via portion (portion to fill up the via hole VH2) of the wiring M2b penetrates the thin film part B1a of the barrier insulating film B1 formed over the electrode DE1 and is coupled to the electrode DE1. The wiring M2b is embedded in the wiring trench TR2 formed in the interlayer insulating film IL2 by the damascene method as with the wiring M2. The wiring M2b is a damascene wiring (damascene copper wiring, embedded copper wiring) with copper as a main constituent (main component).

Incidentally, in the area in which the electrode DE1 and the electrode DE2 are opposed to each other through the barrier insulating film B1 without via the interlayer insulating film IL2, the barrier insulating film B1 interposed between the electrode DE1 and the electrode DE2 is configured as the thick film part B1b other than the thin film part B1a. Therefore, in the area to couple the via portion (portion to fill up the via hole VH2) of the wiring M2b to the electrode DE1 and in the vicinity of the area with respect to the electrode DE1, the thin film part B1a of the barrier insulating film B1 is formed over the electrode DE1, whereas in the area of the electrode DE1, which is superimposed on the electrode DE2 in plan view, the thick film part B1b of the barrier insulating film B1 is formed over the electrode DE1.

<Manufacturing Method of Semiconductor Device>

FIGS. 4 to 22 are respectively fragmentary sectional diagrams in a manufacturing process of the semiconductor device according to the present embodiment.

Figure 4:
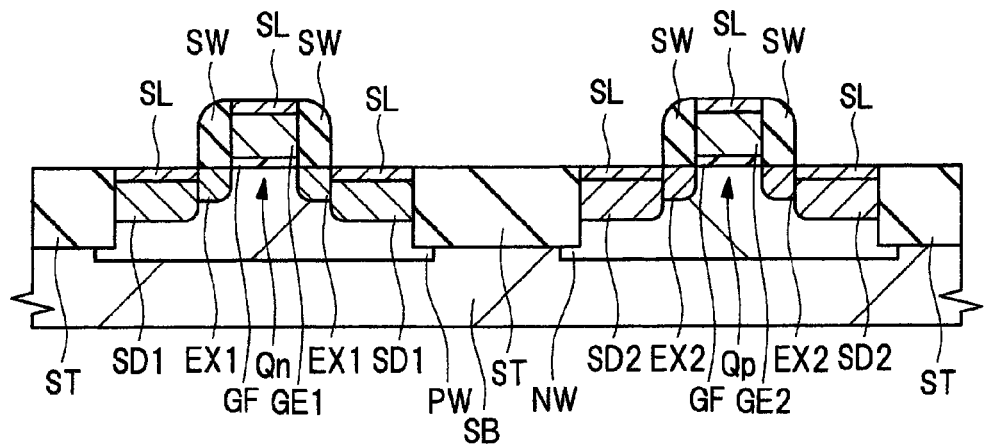
FIG. 4 is a fragmentary sectional diagram in a manufacturing process of the semiconductor device according to the one embodiment.

First, as shown in FIG. 4, a semiconductor substrate (semiconductor wafer) SB comprised of, for example, p-type monocrystalline silicon or the like having a specific resistance of about 1 to 10 Ωcm is provided.

Next, element isolation regions ST are formed in the semiconductor substrate SB. Each element isolation region ST can be formed by an STI (Shallow Trench Isolation) method.

Next, semiconductor elements such as an n channel type MISFET (Metal Insulator Semiconductor Field Effect Transistor) Qn and a p channel type MISFET Qp or the like are formed in the semiconductor substrate SB. The MISFETs Qn and Qp can be formed in the following manner, for example.

That is, a p-type well PW and an n-type well NW are respectively formed in the semiconductor substrate SB by using an ion implantation method or the like. Then, a gate electrode GE1 for the n channel type MISFET Qn is formed over the p-type well PW through a gate insulating film GF interposed therebetween, and a gate electrode GE2 for the p channel type MISFET Qp is formed over the n-type well NW through a gate insulating film GF interposed therebetween. For example, an insulating film (e.g., silicon oxide film) for the gate insulating film GF and a conductive film (e.g., doped polysilicon film) for the gate electrodes GE1 and GE2 are formed in a main surface of the semiconductor substrate SB in order. Then, the conductive film is patterned to enable the gate electrodes GE1 and GE2 and the gate insulating film GF to be formed.

Then, an n-type impurity is ion-implanted in the p-type well PW using the gate electrode GE1 as a mask to thereby form n⁻ type semiconductor regions EX1 on both sides of the gate electrode GE1 in the p-type well PW. Further, a p-type impurity is ion-implanted in the n-type well NW using the gate electrode GE2 as a mask to thereby form p⁻ type semiconductor regions EX2 on both sides of the gate electrode GE2 in the n-type well NW.

Thereafter, an insulating film for the formation of sidewall spacers SW is formed so as to cover the gate electrodes GE1 and GE2. Then, the insulating film is anisotropically etched to form the sidewall spacers (sidewall insulating film) SW over the sidewalls of the gate electrodes GE1 and GE2.

Then, an n-type impurity is ion-implanted in the p-type well PW by using the gate electrode GE1 and the sidewall spacers SW lying over the sidewalls thereof as a mask to thereby form n⁺ type semiconductor regions SD1 each having an impurity concentration higher than the n⁻ type semiconductor region EX1 on both sides of a structure comprised of the gate electrode GE1 and the sidewall spacers SW lying over the sidewalls thereof at the p-type well PW. Further, a p-type impurity is ion-implanted in the n-type well NW by using the gate electrode GE2 and the sidewall spacers SW lying over the sidewalls thereof as a mask to thereby form p⁺ type semiconductor regions SD2 each having an impurity concentration higher than the p⁻ type semiconductor region EX2 on both sides of a structure comprised of the gate electrode GE2 and the sidewall spacers SW lying over the sidewalls thereof at the n-type well NW. A source-drain region having an LDD structure of the n channel type MISFET Qn is formed by the n⁻ type semiconductor region EX1 and the n⁺ type semiconductor region SD1. A source-drain region having an LDD structure of the p channel type MISFET Qp is formed by the p⁻ type semiconductor region EX2 and the p⁺ type semiconductor region SD2. Thereafter, activation annealing which is a heat treatment for activating the impurities introduced so far is performed. Further, metal silicide layers SL can also be formed in the surfaces (surface layer portions) of the gate electrodes GE1 and GE2, the n⁺ type semiconductor regions SD1 and the p⁺ type semiconductor regions SD2 respectively by a salicide (SelfAlignedSilicide) technique or the like.

Thus, the n channel type MISFET Qn and the p channel type MISFET Qp can be formed in the semiconductor substrate SB. Incidentally, the semiconductor elements formed in the semiconductor substrate SB are not limited to the n channel type MISFET Qn and the p channel type MISFET Qp. Various semiconductor elements can be formed in the semiconductor substrate SB.

Figure 5:
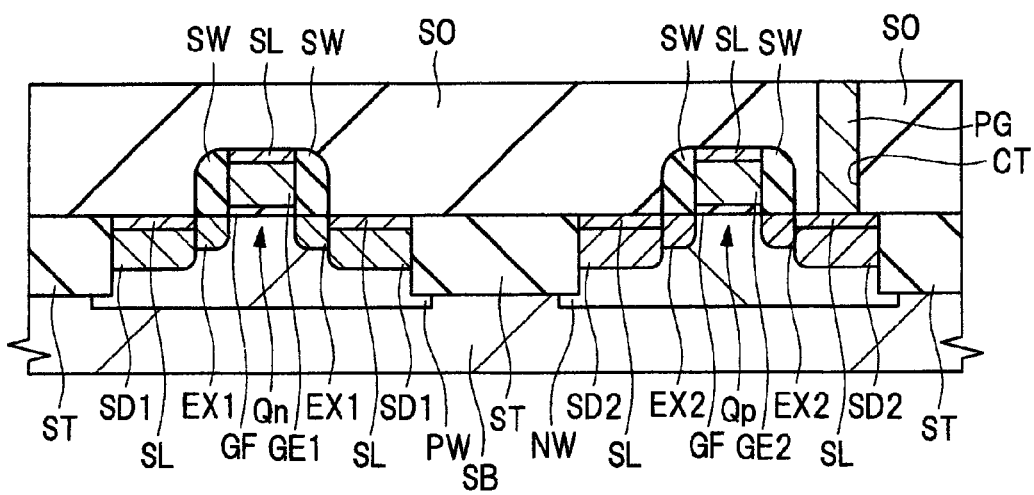
FIG. 5 is a fragmentary sectional diagram in the manufacturing process of the semiconductor device, following FIG. 4.

Next, as shown in FIG. 5, an interlayer insulating film SO is formed over the entire main surface of the semiconductor substrate SB so as to cover the gate electrodes GE1 and GE2 and the sidewall spacers SW by a CVD (Chemical Vapor Deposition) method or the like. The interlayer insulating film SO is comprised of, for example, a single film of a silicon oxide film or a laminated film of a silicon nitride films and a silicon oxide film lying over the silicon nitride film, or the like. After forming the interlayer insulating film SO, the upper surface of the interlayer insulating film SO can also be planarized by polishing of the upper surface of the interlayer insulating film SO by the CMP method, etc.

Next, a photoresist pattern (not shown) is formed over the interlayer insulating film SO by using a photolithography method. The interlayer insulating film SO is etched with the photoresist pattern as an etching mask to thereby form a contact hole CT in the interlayer insulating film SO.

Next, a conductive plug PG is formed in the contact hole CT. In order to form the plug PG, a conductive barrier film (e.g., titanium film, titanium nitride film or laminate film thereof) is first formed over the interlayer insulating film SO including the inside (bottom and sidewalls) of the contact hole CT by a sputtering method or the like. Thereafter, a main conductor film comprised of a tungsten (W) film or the like is formed over the conductive barrier film by the CVD method or the like so as to fill up the contact hole CT. Then, the unnecessary main conductor film and conductive barrier film lying outside the contact hole CT are removed by the CMP (Chemical Mechanical Polishing) method or an etchback method or the like. Thus, the plug PG comprised of the main conductor film and the conductive barrier film embedded and remaining in the contact hole CT can be formed. Incidentally, for simplification of the drawing, the barrier conductor film and the main conductor film which configure the plug PG are integrally shown in FIG. 5.

Figure 6:
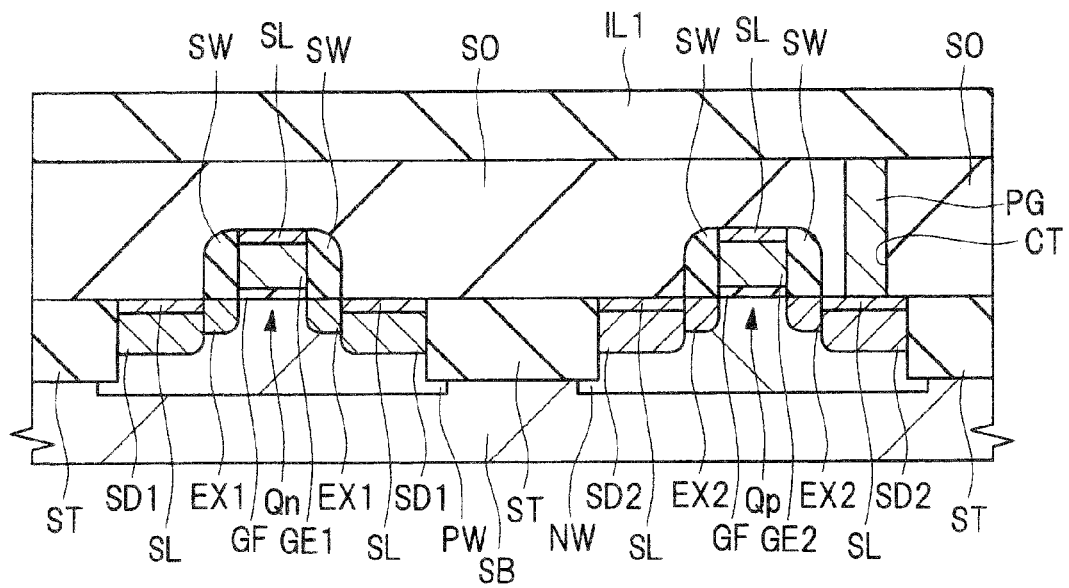
FIG. 6 is a fragmentary sectional diagram in the manufacturing process of the semiconductor device, following FIG. 5.

Next, as shown in FIG. 6, an interlayer insulating film IL1 is formed over the interlayer insulating film SO embedded with the plug PG. A silicon oxide film or a low dielectric constant insulating film or the like is preferably usable as the interlayer insulating film IL1. The interlayer insulating film IL1 can be formed by using the CVD method or the like, for example.

Next, a wiring M1 and an electrode DE1 corresponding to a first layer are formed by a damascene method (single damascene method herein). Specifically, however, the wiring M1 and the electrode DE1 can be formed in the following manner.

Figure 7:
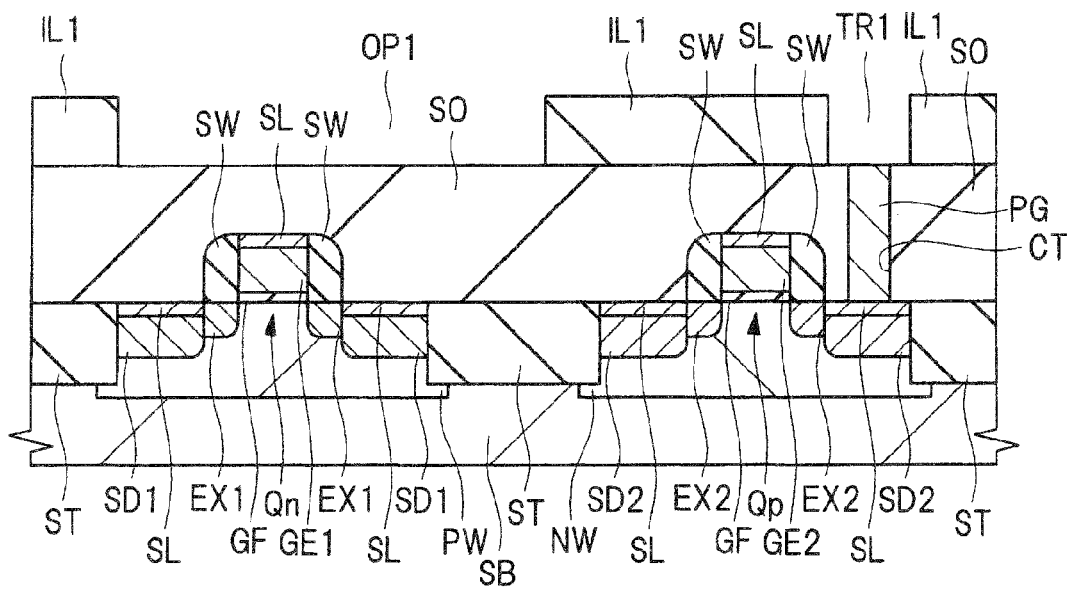
FIG. 7 is a fragmentary sectional diagram in the manufacturing process of the semiconductor device, following FIG. 6.

First, as shown in FIG. 7, a photoresist pattern (not shown) is formed over the interlayer insulating film IL1 by using the photolithography method. Then, the interlayer insulating film IL1 is etched with the photoresist pattern as an etching mask to thereby form an opening OP1 and a wiring trench (groove, opening) TR1 in the interlayer insulating film IL1.

Figure 8:
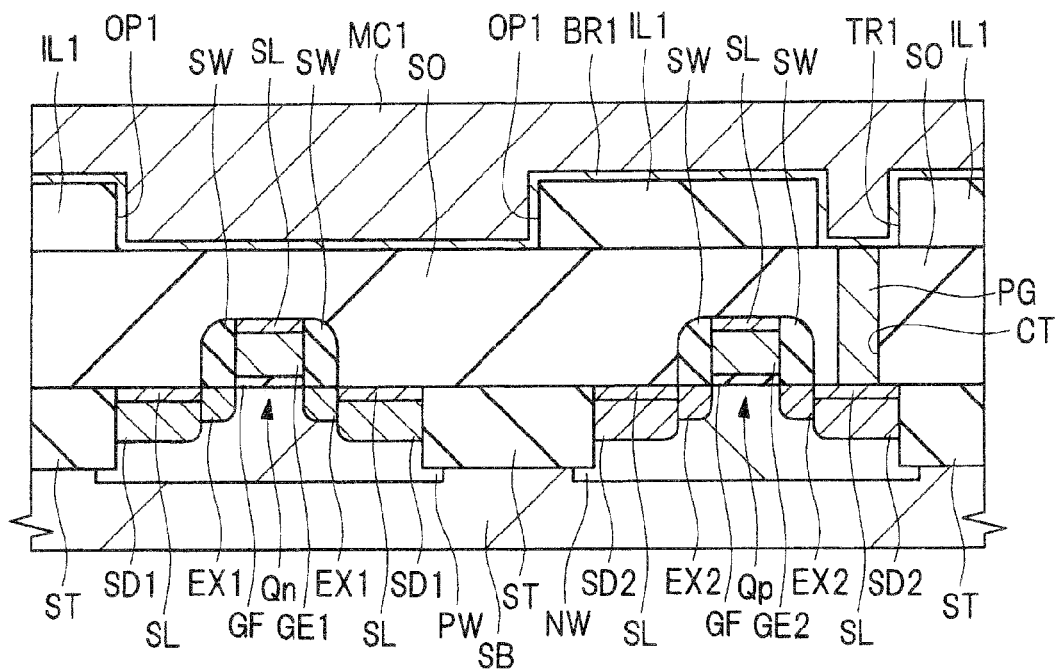
FIG. 8 is a fragmentary sectional diagram in the manufacturing process of the semiconductor device, following FIG. 7.

Then, as shown in FIG. 8, a barrier conductor film (barrier metal film) BR1 is formed over the main surface of the semiconductor substrate SB, i.e., the interlayer insulating film IL1 including over the inner surfaces (bottom and sidewalls) of the wiring trench TR1 and the opening OP1. The barrier conductor film BR1 is comprised of, for example, a tantalum film, a tantalum nitride film or a laminated film of these.

Thereafter, a main conductor film MC1 principally comprised of copper is formed over the barrier conductor film BR1 so as to bury (fill up) the interior of the opening OP1 and the wiring trench TR1. The main conductor film MC1 is comprised of, for example, a relatively thin copper seed layer formed over the barrier conductor film BR1 by using the CVD method or the sputtering method or the like, and a relatively thick copper plating film formed over the copper seed layer by using an electroplating method or the like. The copper plating film can fill in the opening OP1 and the wiring trench TR1. The main conductor film MC1 is thicker than the barrier conductor film BR1.

Figure 9:
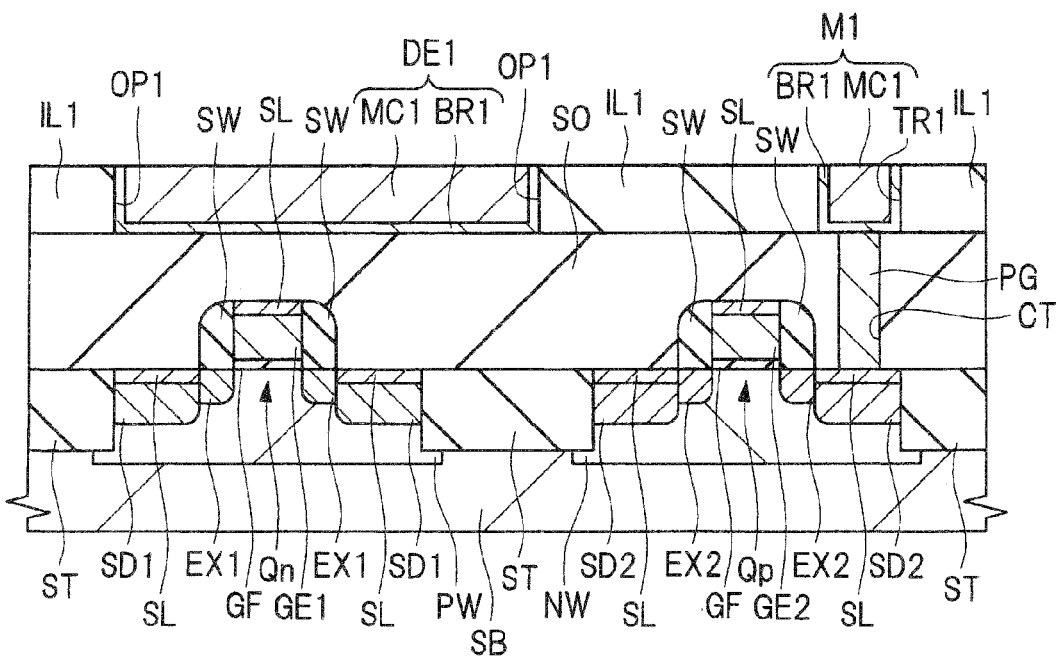
FIG. 9 is a fragmentary sectional diagram in the manufacturing process of the semiconductor device, following FIG. 8.

Then, as shown in FIG. 9, the unnecessary main conductor film MC1 and barrier conductor film BR1 lying outside the opening OP1 and the wiring trench TR1 are removed by polishing processing or the like based on the CMP method to leave the main conductor film MC1 and the barrier conductor film BR1 within the opening OP1 and the wiring trench TR1, whereby the electrode DE1 and the wiring M1 are formed. The electrode DE1 is comprised of the main conductor film MC1 and the barrier conductor film BR1 embedded in the opening OP1. The wiring M1 is comprised of the main conductor film MC1 and the barrier conductor film BR1 embedded in the wiring trench TR1. The upper surface of the interlayer insulating film IL1 is exposed, and the upper surface of the interlayer insulating film IL1, the upper surface of the electrode DE1, and the upper surface of the wiring M1 respectively form a substantially flat surface.

Thus, the wiring M1 and the electrode DE1 can be formed. Incidentally, although a description has been made here about the case where the electrode DE1 of the capacitive element CP is formed in the first-layer wiring layer, the electrode DE1 of the capacitive element CP can also be formed in a wiring layer located above the first-layer wiring layer as another form. If the electrode DE1 and the wiring M1 formed in the same process as the electrode DE1 are formed in the wiring layer higher than the first-layer wiring layer, the electrode DE1 and the wiring M1 may be formed by a single damascene method or a dual damascene method.

Incidentally, the illustration of the structure located below the interlayer insulating film IL1 is omitted in subsequent FIGS. 10 to 22 for simplification of the drawings.

Figure 10:
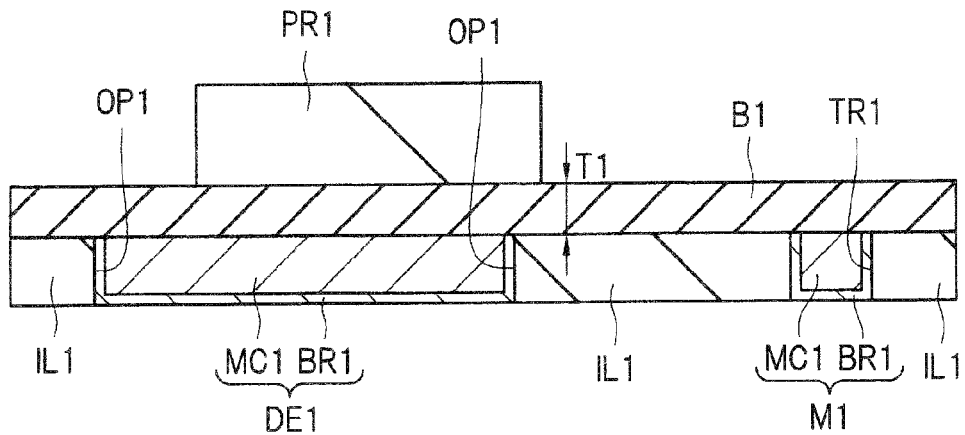
FIG. 10 is a fragmentary sectional diagram in the manufacturing process of the semiconductor device, following FIG. 9.

Next, as shown in FIG. 10, a barrier insulating film B1 is formed over the interlayer insulating film IL1 with the electrode DE1 and the wiring M1 embedded therein, so as to cover the electrode DE1 and the wiring M1. Preferably, the barrier insulating film B1 is preferably comprised of a silicon nitride (SiN) film, a silicon carbide (SiC) film or a silicon carbonitride (SiCN) film and can be formed by using the CVD method or the like. In the stage of film deposition of the barrier insulating film B1, the barrier insulating film B1 has a substantially uniform thickness (film thickness). The thickness (film thickness) of the barrier insulating film B1 becomes a thickness T1. The thickness (forming film thickness) of the barrier insulating film B1 at its film deposition stage can be taken to be about 60 to 300 nm, for example.

Next, a photoresist pattern (resist pattern, mask layer) PR1 is formed over the barrier insulating film B1 by using the photolithography method. Since the photoresist pattern PR1 is used as an etching mask layer, it can be assumed to be a mask layer.

Figure 11:
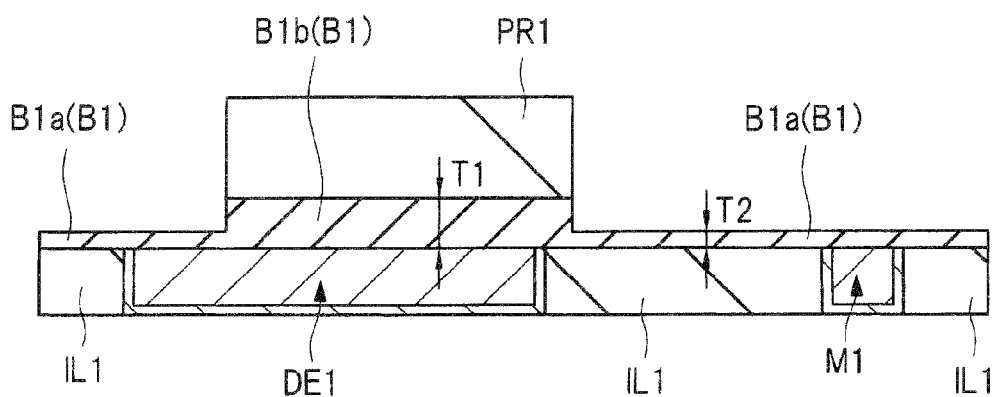
FIG. 11 is a fragmentary sectional diagram in the manufacturing process of the semiconductor device, following FIG. 10.
Figure 12:
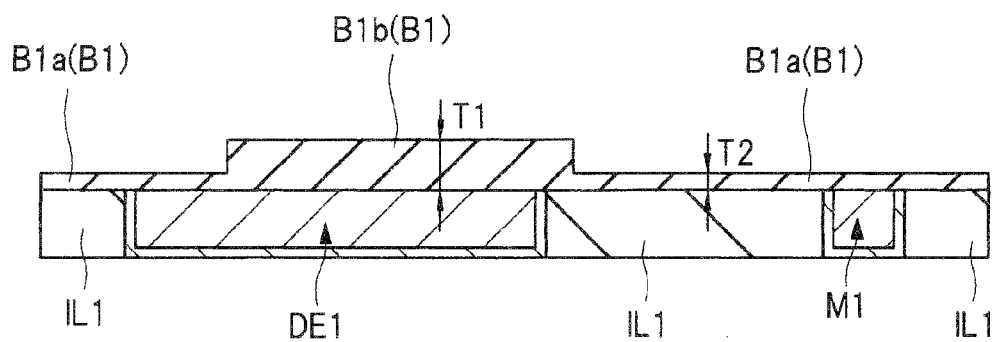
FIG. 12 is a fragmentary sectional diagram in the manufacturing process of the semiconductor device, following FIG. 11.

Next, as shown in FIG. 11, the barrier insulating film B1 is etched using the photoresist pattern PR1 as an etching mask to thereby make thin the thickness (film thickness) of the barrier insulating film B1 of the portion exposed without being covered with the photoresist pattern PR1. At this time, the barrier insulating film B1 of the portion exposed without being covered with the photoresist pattern PR1 is processed such that part of its thickness remains without etching it over the entire thickness thereof. Thereafter, the photoresist pattern PR1 is removed as shown in FIG. 12.

Thus, the barrier insulating film B1 results in one having a thin film part B1$a$ and a thick film part B1$b$ thicker than the thin film part B1$a$. The barrier insulating film B1 of the portion covered with the photoresist pattern PR1 becomes the thick film part B1$b$, and the barrier insulating film B1 of the portion exposed without being covered with the photoresist pattern PR1 becomes the thin film part B1$a$. While the barrier insulating film B1 of the portion exposed without being covered with the photoresist pattern PR1 is made thin in thickness by etching, the barrier insulating film B1 of the portion covered with the photoresist pattern PR1 is not etched because the photoresist pattern PR1 functions as the etching mask. Accordingly, the thickness of the barrier insulating film B1 remains unchanged before and after the etching. Therefore, the thickness of the thick film part B1$b$ of the barrier insulating film B1 is the same as the thickness T1 of the barrier insulating film B1 at its film deposition. The thickness (T2) of the thin film part B1$a$ of the barrier insulating film B1 becomes thinner than the thickness (T1) of the thick film part B1$b$ of the barrier insulating film B1 (i.e., T1>T2). The thin film part B1$a$ of the barrier insulating film B1 has a substantially uniform thickness. Further, the thick film part B1$b$ of the barrier insulating film B1$b$ has a substantially uniform thickness. The thickness (T2) of the thin film part B1$a$ of the barrier insulating film B1 can be taken to be about 30 to 100 nm, for example.

Even in this stage, the wiring M1 and the electrode DE1 are held in a state of being covered with the barrier insulating film B1. However, the upper surface of the wiring M1 is covered with the thin film part B1$a$ of the barrier insulating film B1 without being covered with the thick film part B1$b$ of the barrier insulating film B1. On the other hand, the upper surface of the electrode DE1 is covered at least partially with the thick film part B1$b$ of the barrier insulating film B1. When the area not covered with the thick film part B1$b$ of the barrier insulating film B1 exists within the upper surface of the electrode DE1, the area is covered with the thin film part B1$a$ of the barrier insulating film B1.

Figure 13:
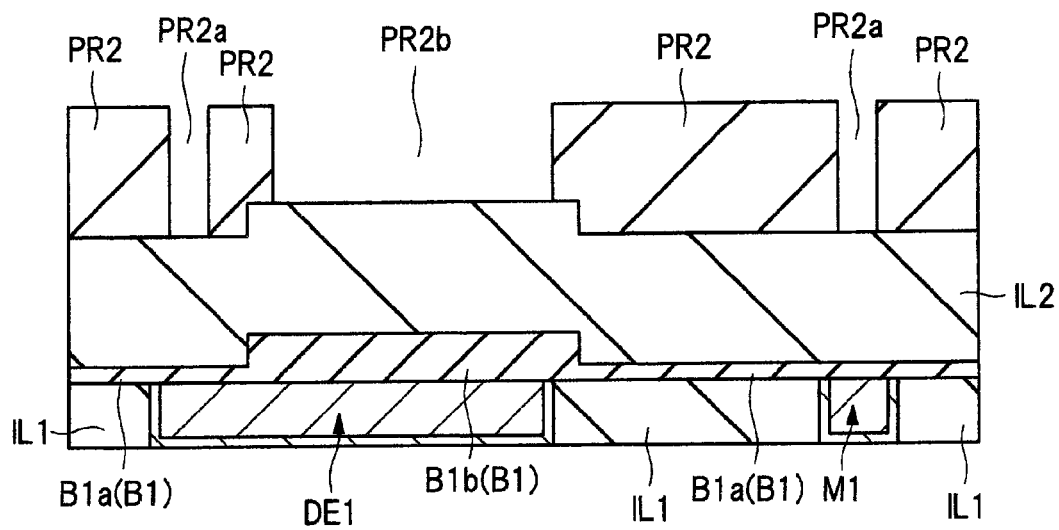
FIG. 13 is a fragmentary sectional diagram in the manufacturing process of the semiconductor device, following FIG. 12.

Next, as shown in FIG. 13, an interlayer insulating film IL2 is formed over the barrier insulating film B1 having the thin film part B1$a$ and the thick film part B1$b$. As the interlayer insulating film IL2, a silicon oxide film or a low dielectric constant insulating film or the like is preferably usable. The interlayer insulating film IL2 can be formed by using the CVD method or the like, for example. The thickness (forming film thickness) of the interlayer insulating film can be taken to be about 300 to 600 nm, for example.

Next, via holes (holes) VH2 and an opening OP2 are formed in the interlayer insulating film IL2. Each via hole VH2 and the opening OP2 can be formed in the following manner, for example.

First, as shown in FIG. 13, a photoresist pattern (resist pattern, mask layer) PR2 is formed over the barrier insulating film B1 by using the photolithography method. Since the photoresist pattern PR2 is used as an etching mask layer, it can be assumed to be a mask layer. The photoresist pattern PR2 has an opening PR2$a$ which exposes an area where the via hole VH2 is to be formed, and an opening PR2$b$ which exposes an area where the opening OP2 is to be formed.

Figure 14:
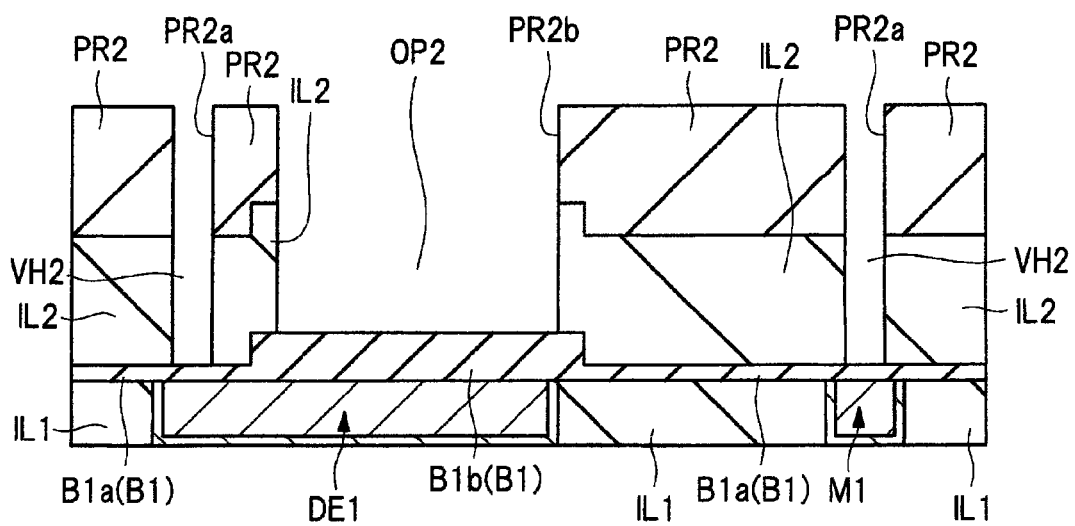
FIG. 14 is a fragmentary sectional diagram in the manufacturing process of the semiconductor device, following FIG. 13.

Then, as shown in FIG. 14, the interlayer insulating film IL2 is etched using the photoresist pattern PR2 as an etching mask to thereby form the via holes VH2 and the opening OP2 in the interlayer insulating film IL2. At this time, the interlayer insulating film IL2 of the portion exposed from the opening PR2$a$ of the photoresist pattern PR2 is etched to form the via hole VH2. The interlayer insulating film IL2 of the portion exposed from the opening PR2$b$ of the photoresist pattern PR2 is etched to form the opening OP2.

When the interlayer insulating film IL2 is etched to form the via holes VH2 and the opening OP2, it is possible to allow the barrier insulating film B1 to function as an etching stopper film. Therefore, the interlayer insulating film IL2 is preferably etched under etching conditions at which the barrier insulating film B1 is hard to be etched as compared with the interlayer insulating film IL2. In other words, the interlayer insulating film IL2 is preferably etched under etching conditions at which the interlayer insulating film IL2 is easier to be etched compared with the barrier insulating film B1.

Figure 15:
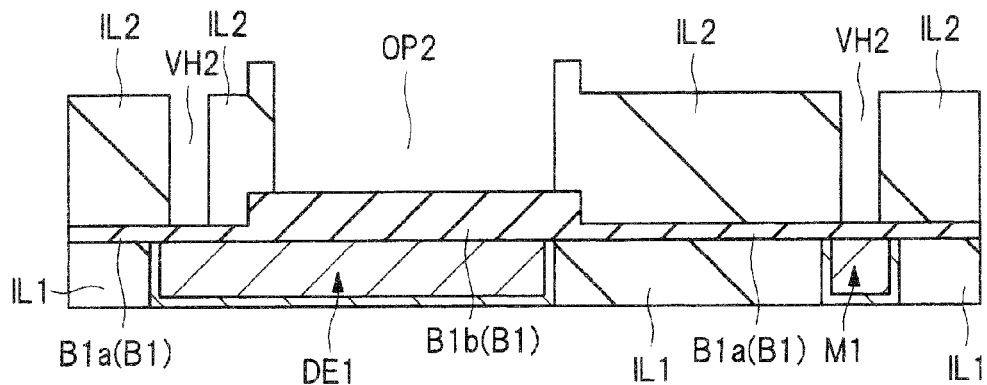
FIG. 15 is a fragmentary sectional diagram in the manufacturing process of the semiconductor device, following FIG. 14.

Thereafter, as shown in FIG. 15, the photoresist pattern PR2 is removed.

Thus, the via holes VH2 and the opening OP2 can be formed in the interlayer insulting film IL2. The via holes VH2 and the opening OP2 are formed in the same process.

Both the via holes VH2 and the opening OP2 penetrate the interlayer insulating film IL2 and thereby expose the barrier insulating film B1 at the bottoms thereof. However, the thin film part B1a of the barrier insulating film B1 is exposed at the bottom of each via hole VH2, and the thick film part B1b of the barrier insulating film B1 is exposed at the bottom of the opening OP2. Since the opening OP2 is formed so as to be internally included in the thick film part B1b of the barrier insulating film B1 in plan view, the thick film part B1b of the barrier insulating film B1 is exposed at the bottom of the opening OP2 without exposing the thin film part B1a of the barrier insulating film B1. On the other hand, since each via hole VH2 is formed over the thin film part B1a of the barrier insulating film B1, the thin film part B1a of the barrier insulating film B1 is exposed at the bottom of the via hole VH2 without exposing the thick film part B1b of the barrier insulating film B1. A plane size (plane area) of the opening OP2 is larger than a plane size (plane area) of the via hole VH2.

Next, wiring trenches (grooves) TR2 are formed in the interlayer insulating film IL2. The wiring trenches TR2 can be formed in the following manner, for example.

Figure 16:
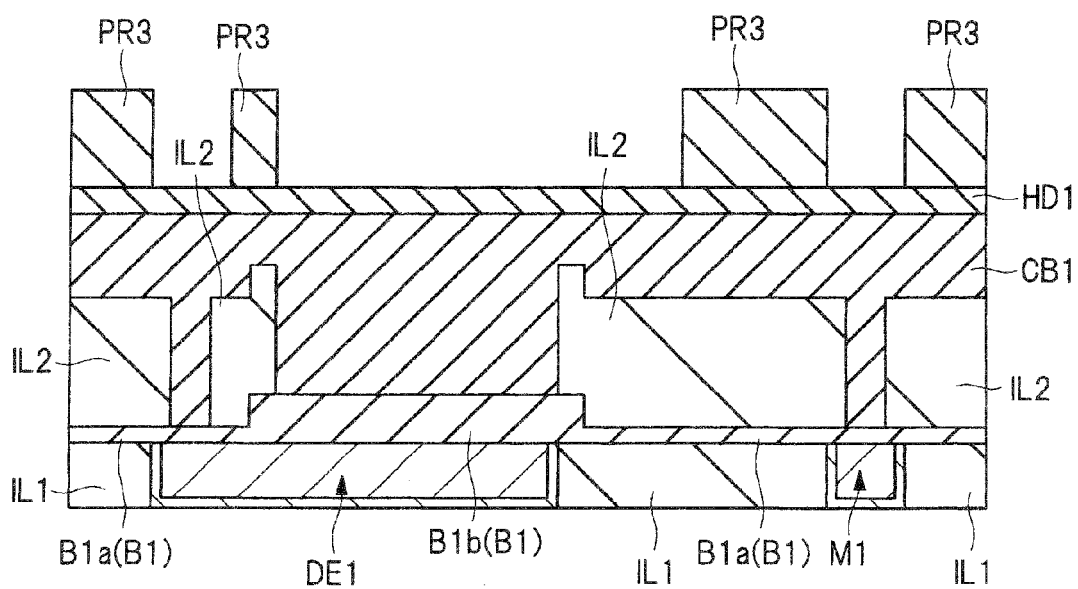
FIG. 16 is a fragmentary sectional diagram in the manufacturing process of the semiconductor device, following FIG. 15.

First, as shown in FIG. 16, an insulating film CB1 is formed over the interlayer insulating film IL2 so as to bury the interior of the via holes VH2 and the opening OP2 (fill in them). The insulating film CB1 is preferably formed by a material easy to be selectively removed later. The insulating film CB1 is comprised of, for example, an organic film (organic insulating film) or a resist film (resist material film) or the like. Then, an insulating film HD1 for a hard mask comprised of a silicon oxide film or the like is formed over the insulating film CB1. Thereafter, a photoresist pattern (resist pattern, mask layer) PR3 is formed over the insulating film HD1 by using the photolithography method. Since the photoresist pattern PR3 is used as an etching mask layer, it can be assumed to be a mask layer. The photoresist pattern PR3 has openings each of which exposes an area where the wiring trench TR2 is to be formed. When the insulating film HD1 for the hard mask is not necessary, it is also possible to omit the formation of the insulating film HD1 for the hard mask.

Figure 17:
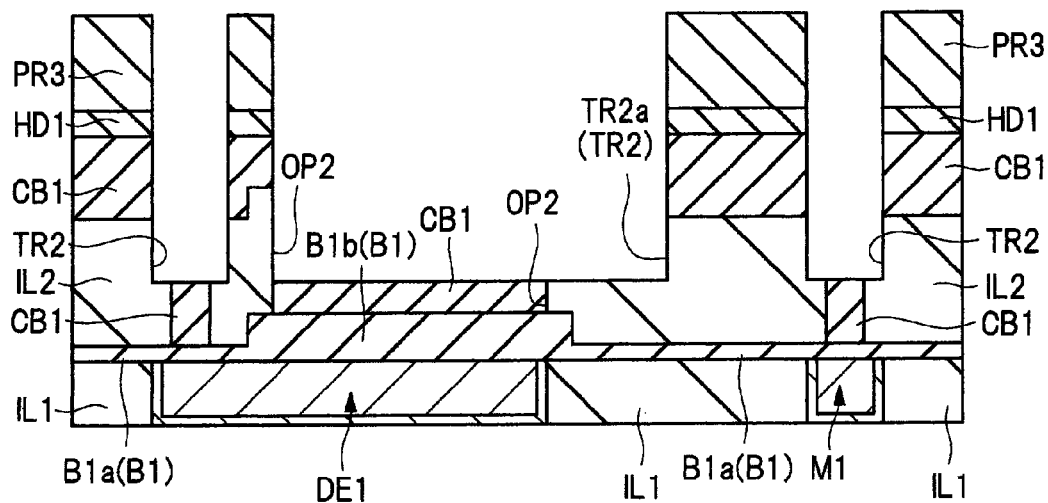
FIG. 17 is a fragmentary sectional diagram in the manufacturing process of the semiconductor device, following FIG. 16.
Figure 18:
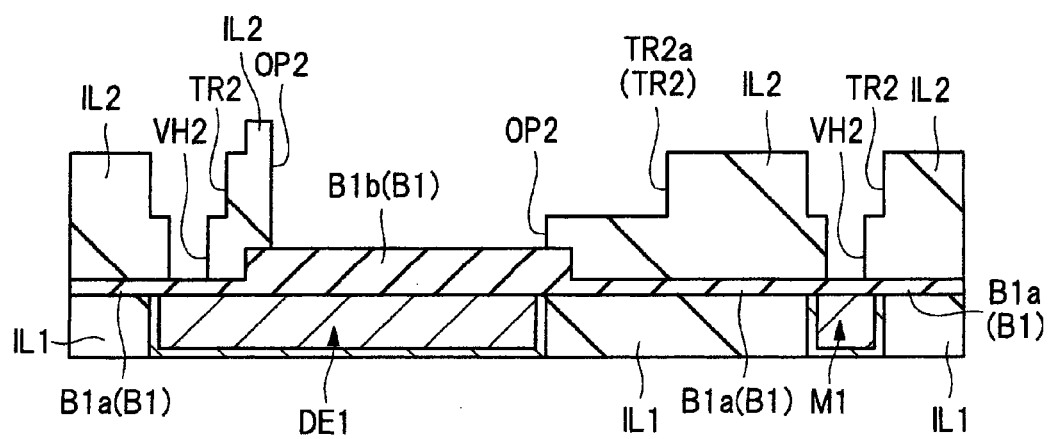
FIG. 18 is a fragmentary sectional diagram in the manufacturing process of the semiconductor device, following FIG. 17.

Then, as shown in FIG. 17, the insulating film HD1, the insulating film CB1, and the interlayer insulating film IL2 are etched using the photoresist pattern PR3 as an etching mask to thereby form the wiring trenches TR2 in the interlayer insulating film IL2. Thereafter, as shown in FIG. 18, the photoresist pattern PR3, the insulating film HD1, and the insulating film CB1 are removed. It is preferable that upon removing them, the photoresist pattern PR3, the insulating film HD1, and the insulating film CB1 are selectively removed while suppressing the interlayer insulating film IL2 and the barrier insulating film B1 from being removed.

Incidentally, FIG. 17 shows the case where the photoresist pattern PR3 and the insulating film CB1 are left at the stage in which etching is completed. However, it is also possible that the photoresist pattern PR3 does not remain at the stage in which the etching is finished (i.e., all of the photoresist pattern PR3 is removed by etching). In that case, the insulating film HD1 is capable of functioning as an etching mask for etching the interlayer insulating film IL2. Further, it is also possible that the photoresist pattern PR3 and the insulating film HD1 are not left at the stage in which the etching is finished (i.e., all is removed by etching). In that case, the insulating film CB1 can function as an etching mask for etching the interlayer insulating film IL2.

Thus, the wring trenches TR2 can be formed in the interlayer insulating film IL2. The bottom face of each wiring trench TR2 is positioned in the middle of the thickness of the interlayer insulating film IL2. That is, the wiring trench TR2 does not penetrate the interlayer insulating film IL2, and the bottom face of the wiring trench TR2 is positioned in the middle of the thickness of the interlayer insulating film IL2. Incidentally, a wiring trench TR2a of the wiring trench TR2 is coupled to the opening OP2, and the wiring trenches TR2 other than the wiring trench TR2a are not coupled to the opening OP2.

Thus, the opening OP2, the via holes VH2, and the wiring trenches TR2 are formed in the interlayer insulating film IL2. When the opening OP2, the via holes VH2, and the wiring trenches TR2 are formed, each via hole VH2 is internally included in the wiring trench TR2 in plan view, the bottom face of the wiring trench TR2 excepting for the via hole VH2 is positioned in the middle of the thickness of the interlayer insulating film IL2, the via hole VH2 penetrates the interlayer insulating film IL2, and the thin film part B1a of the barrier insulating film B1 is exposed at the bottom of the via hole VH2. Further, when the opening OP2, the via holes VH2, and the wiring trenches TR2 are formed, the wiring trench TR2a of the wiring trench TR2 is coupled to the opening OP2, the bottom face of the wiring trench TR2a is positioned in the middle of the thickness of the interlayer insulating film IL2, the opening OP2 penetrates the interlayer insulating film IL2, and the thick film part B1b of the barrier insulating film B1 is exposed at the bottom of the opening OP2.

Incidentally, in the present embodiment, the opening OP2 and the via holes VH2 are formed in the interlayer insulating film IL2 and then the wiring trenches TR2 are formed in the interlayer insulting film IL2. As another form, the wiring trenches TR2 are formed in the interlayer insulating film IL2 and thereafter the opening OP2 and the via holes VH2 can also be formed in the interlayer insulating film IL2.

Figure 19:
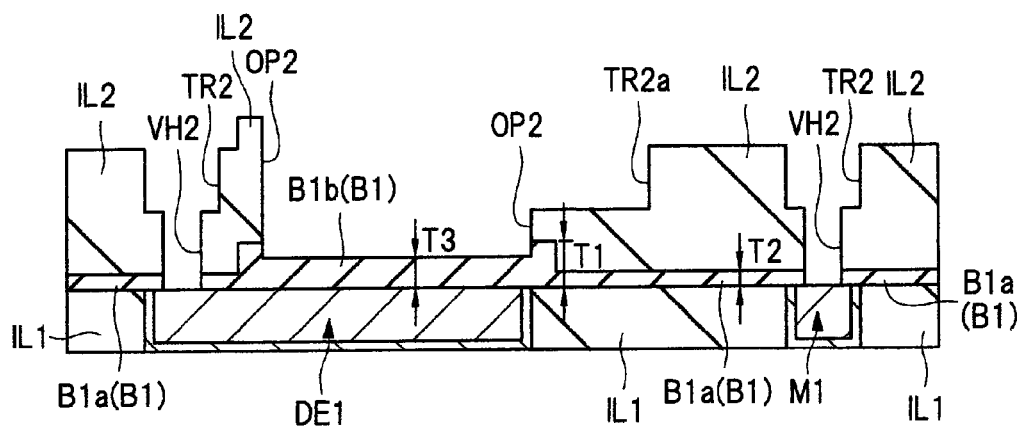
FIG. 19 is a fragmentary sectional diagram in the manufacturing process of the semiconductor device, following FIG. 18.

Next, as shown in FIG. 19, the barrier insulating film B1 of the portion exposed from the bottom of each via hole VH2 is removed by etching. Thus, the upper surface of the wiring M1 is exposed at the bottom of the via hole VH2. Upon this etching, the thick film part B1b of the barrier insulating film B1 exposed from the opening OP2 is also etched so that its thickness is made thin. Incidentally, this etching (etching step) will be referred to as an etching step of FIG. 19 subsequently for simplification.

In the etching step of FIG. 19, the barrier insulating film B1 is preferably etched under etching conditions at which the interlayer insulating film IL2 is hard to be etched as compared with the barrier insulating film B1. In other words, it is preferable that in the etching step of FIG. 19, the barrier insulating film B1 is etched under etching conditions at which the barrier insulating film B1 is easier to be etched as compared with the interlayer insulating film IL2. Thus, in the etching step of FIG. 19, the barrier insulating film B1 at the bottom of the via hole VH2 is removed by etching while suppressing or preventing the interlayer insulating film IL2 from being etched, thereby enabling the wiring M1 (its upper surface) to be exposed at the bottom of the via hole VH2.

In the etching step of FIG. 19, the barrier insulating film B1 is not only removed by etching at the bottom of the via hole VH2, but the thick film part B1b of the barrier insulating film B1 exposed from the opening OP2 is etched, whereby the thickness thereof becomes thin.

Here, in the stage before the etching step of FIG. 19 is performed, the thin film part B1a of the barrier insulating film B1 has existed in the bottom of each via hole VH2, and the thick film part B1b of the barrier insulating film B1 has existed in the bottom of the opening OP2. The thickness (T1) of the thick film part B1b has been thicker than the thickness (T2) of the thing film part B1a. Therefore, when the etching step of FIG. 19 is performed, the thin film part B1a of the barrier insulating film B1 is removed at the bottom of each via hole VH2 to expose the wiring M1 (its upper surface) at the bottom of the via hole VH2. On the other hand, the thickness of the thick film part B1b of the barrier insulating film B1 becomes thinner than before etching at the bottom of the opening OP2. However, the remaining state of the barrier insulating film B1 in a layer form can be maintained at the bottom of the opening OP2. That is, when the etching step of FIG. 19 is completed, the barrier insulating film B1 remains in the layer form at the bottom of the opening OP2, and the electrode DE1 is not exposed from the opening OP2.

Further, in the stage in which the etching step of FIG. 19 is finished, the thickness (T3) of the thick film part B1b of the barrier insulating film B1 exposed at the bottom of the opening OP2 is preferably thicker than the thickness (T2) of the thin film part B1a of the barrier insulating film B1 (T3>T2). Therefore, the thickness (T1) at the film deposition of the barrier insulating film B1 may be set in above FIG. 10 considering that the thick film part B1b of the barrier insulating film B1 of the portion exposed at the bottom of the opening OP2 is made thin in the etching step of FIG. 19.

For example, when after the etching step of FIG. 19, the thick film part B1b of the barrier insulating film B1 of the portion exposed at the bottom of the opening OP2 needs to have a thickness of 60 nm, and the amount of etching of the barrier insulating film B1 at the bottom of the opening OP2 is 40 nm in the etching step of FIG. 19, the thickness (T1) at the film deposition of the barrier insulating film B1 may be set to 100 nm in above FIG. 10. Further, for example, when after the etching step of FIG. 19, the thick film part B1b of the barrier insulating film B1 of the portion exposed at the bottom of the opening OP2 needs to have a thickness of 120 nm, and the amount of etching of the barrier insulating film B1 at the bottom of the opening OP2 is 80 nm in the etching step of FIG. 19, the thickness (T1) at the film deposition of the barrier insulating film B1 may be set to 200 nm in above FIG. 10. Further, the thickness (T2) of the thin film part B1a of the barrier insulating film B1 can be controlled to a desired thickness by adjusting the amount of etching of the barrier insulating film B1 in the etching step of above FIG. 11. Accordingly, in the stage in which the etching step of FIG. 19 is finished, the thickness (T3) of the thick film part B1b of the barrier insulating film B1 of the portion exposed at the bottom of the opening OP2, and the thickness (T2) of the thin film part B1a of the barrier insulating film B1 can respectively be controlled to a desired thickness. Therefore, in the stage in which the etching step of FIG. 19 is finished, the thickness (T3) of the thick film part B1b of the barrier insulating film B1 of the portion exposed at the bottom of the opening OP2 can be made thicker (T3>T2) than the thickness (T2) of the thin film part B1a of the barrier insulating film B1.

Next, the wiring M2 and the electrode DE2 are formed by the damascene method (dual damascene method herein). Specifically, however, the wiring M2 and the electrode DE2 can be formed in the following manner.

Figure 20:
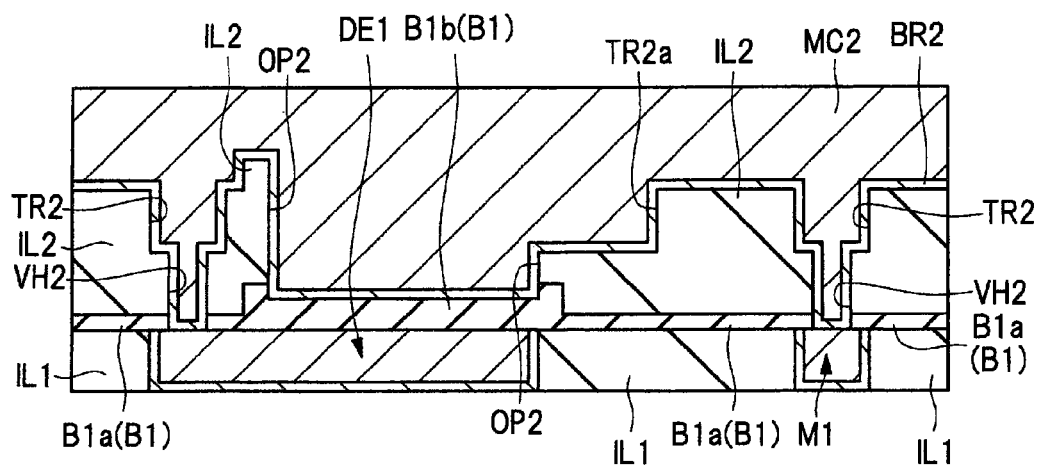
FIG. 20 is a fragmentary sectional diagram in the manufacturing process of the semiconductor device, following FIG. 19.

First, as shown in FIG. 20, a barrier conductor film (barrier metal film) BR2 is formed on the main surface of the semiconductor substrate SB, i.e., the interlayer insulating film IL2 including over the inner surfaces (bottom and sidewalls) of the wiring trenches TR2, the via holes VH2, and the opening OP2. The barrier conductor film BR2 is comprised of, for example, a tantalum film, a tantalum nitride film or a laminated film of these.

Then, a main conductor film MC2 principally comprised of copper is formed over the barrier conductor film BR2 so as to bury (fill in) the interior of the opening OP2, the wiring trenches TR2, and the via holes VH2. The main conductor film MC2 is comprised of, for example, a relatively thin copper seed layer formed over the barrier conductor film BR2 by using the CVD method or the sputtering method or the like, and a relatively thick copper plating film formed over the copper seed layer by using the electroplating method or the like. The copper plating film can fill in the opening OP2, the wiring trenches TR2, and the via holes VH2. The main conductor film MC2 is thicker than the barrier conductor film BR2.

Figure 21:
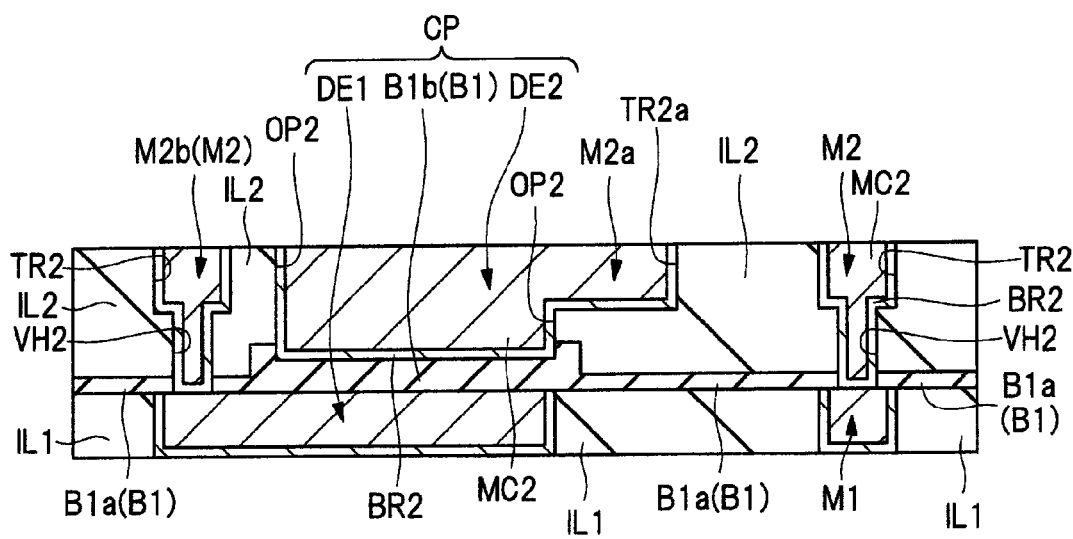
FIG. 21 is a fragmentary sectional diagram in the manufacturing process of the semiconductor device, following FIG. 20.

Thereafter, as shown in FIG. 21, the unnecessary main conductor film MC2 and barrier conductor film BR2 lying outside the opening OP2 and the wiring trenches TR2 are removed by polishing processing or the like based on the CMP method to leave the main conductor film MC2 and the barrier conductor film BR2 within the opening OP2, the wiring trenches TR2, and the via holes VH2, whereby the electrode DE2 and the wiring M2 are formed. The electrode DE2 is comprised of the main conductor film MC2 and the barrier conductor film BR2 embedded in the opening OP2. The wiring M2 is comprised of the main conductor film MC2 and the barrier conductor film BR2 embedded in each wiring trench TR2. A via portion of the wiring M2 is comprised of the main conductor film MC2 and the barrier conductor film BR2 embedded in the via hole VH2. The upper surface of the interlayer insulating film IL2 is exposed, and the upper surface of the interlayer insulating film IL2, the upper surface of the electrode DE2, and the upper surface of the wiring M2 respectively form a substantially flat surface.

Thus, the wiring M2 and the electrode DE2 can be formed. A capacitive element CP is formed by the electrode DE1, the electrode DE2, and the barrier insulating film B1 (thick film part B1b) interposed between the electrode DE1 and the electrode DE2. Incidentally, since the wiring trench TR2a is coupled to the opening OP2, the wiring M2a embedded in the wiring trench TR2a, of the wiring M2 is formed integrally with the electrode DE2. Each wiring M2 other than the wiring M2a is formed away from the electrode DE2.

Figure 22:
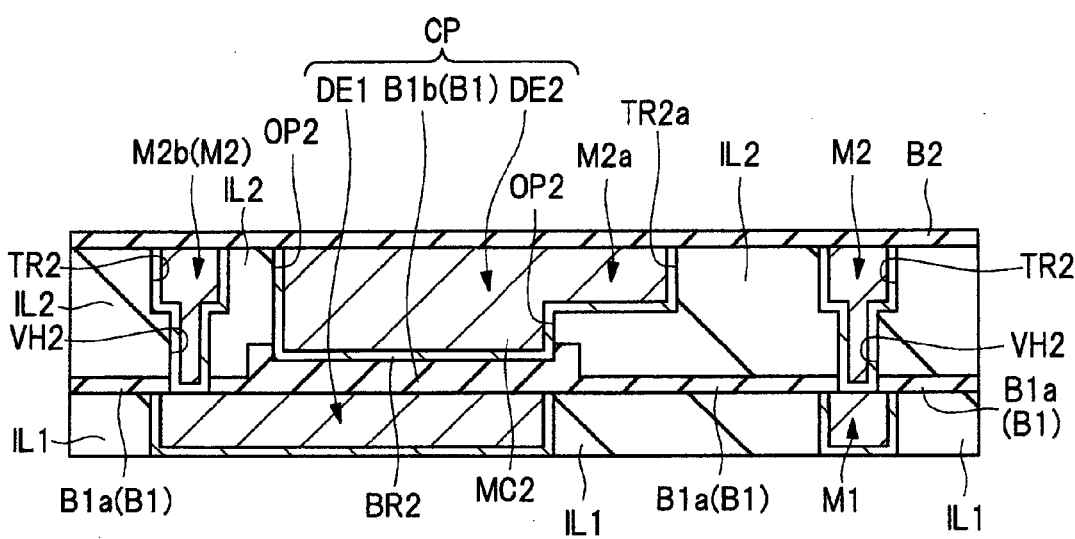
FIG. 22 is a fragmentary sectional diagram in the manufacturing process of the semiconductor device, following FIG. 21.

Next, as shown in FIG. 22, a barrier insulating film B2 is formed over the interlayer insulating film IL2 embedded with the electrode DE2 and the wirings M2 so as to cover the electrode DE2 and the wirings M2. The barrier insulating film B2 is preferably comprised of a silicon nitride (SiN) film, a silicon carbide (SiC) film or a silicon carbonitride (SiCN) film and can be formed by using the CVD method or the like.

Thereafter, interlayer insulating films and wirings or the like are further formed over the barrier insulating film B2, but their illustrations and description will be omitted herein.

Studies of the Present Inventors

The present inventors have examined a technique of when a wiring structure (multilayer wiring structure) having a plurality of wiring layers is formed over a semiconductor substrate, forming a MIM type capacitive element within the wiring structure.

As the characteristic of the MIM type capacitive element, a high breakdown voltage (insulation breakdown voltage) may be required. In order to enhance the breakdown voltage of the MIM type capacitive element, it is effective to increase the physical thickness of a capacitance insulating film interposed between an upper electrode of the capacitive element and its lower electrode.

Further, when a film different from a film necessary to form the wiring structure is used as the capacitance insulating film of the MIM type capacitive element, the number of steps increased with the formation of the capacitive element within the wiring structure increases, thus leading to an increase in the manufacturing time of the semiconductor device and an increase in the manufacturing cost thereof.

Therefore, it is considered that an interlayer insulating film is used as the capacitance insulating film of the MIM type capacitive element. When, however, the interlayer insulating film is used as the capacitance insulating film of the MIM type capacitive element, the interlayer insulating film is low in dielectric constant, thereby leading to the occurrence of lowering of the capacitance value of the capacitive element. There is a fear that when the dielectric constant of the interlayer insulating film is made high to increase the capacitance value, a parasitic capacitance between adjacent wirings increases in each wiring embedded in the interlayer insulating film, thereby leading to the occurrence of degradation in the performance of the semiconductor device.

Thus, the present inventors have examined that a barrier insulating film formed over the interlayer insulating film embedded with the wirings is used as the capacitance insulating film of the MIM type capacitive element.

In that case, however, there is a fear that since the barrier insulating film covering each wiring becomes thick when the barrier insulating film is made thick in thickness, the parasitic capacitance formed between the wiring and a wiring higher one than the wiring increases, thereby degrading the performance of the semiconductor device. This is because since an insulating material suitable as for the barrier insulating film is high in dielectric constant, an increase in the thickness of the barrier insulating film will lead to an increase in the parasitic capacitance between the upper and lower wirings. On the other hand, however, when the barrier insulating film is made thin in thickness, the barrier insulating film which is interposed between upper and lower electrodes and functions as the capacitance insulating film also becomes thin. Consequently, a breakdown voltage (insulation breakdown voltage) between the upper and lower electrodes is lowered, so that the reliability of the MIM type capacitive element is degraded.

Further, it is possible to allow the barrier insulating film even as an etching stopper film upon forming each via hole (corresponding to the above via hole VH2) in the interlayer insulating film lying over the wiring. There is however a fear that when the barrier insulating film is made too thick in thickness, overetching occurs and thereby the wiring is damaged when the barrier insulating film is removed at the bottom of the via hole to expose the wiring. This is because as the thickness of the insulating film to be opened increases, the amount of overetching is required to increase in order to prevent a failure in opening.

Therefore, the above-described problems arise where the barrier insulating film is used even as the capacitance insulating film of the MIM type capacitive element.

Main Features and Advantageous Effects

The semiconductor device according to the present embodiment is a semiconductor device having a semiconductor substrate (SB), a wiring structure formed over the semiconductor substrate (B) and including a plurality of wiring layers, and a capacitive element CP formed in the wiring structure.

The wiring structure has an interlayer insulating film IL1 (first interlayer insulating film), a wiring M1 (first wiring) and an electrode DE1 (first electrode) for the capacitive element CP both embedded in the interlayer insulating film IL1, and a barrier insulating film B1 formed over the interlayer insulating film IL1 so as to cover the wiring M1 and the electrode DE1. This wiring structure further includes an interlayer insulating film IL2 (second interlayer insulating film) formed over the barrier insulating film B1, and a wiring M2 (second wiring) and an electrode DE2 (second electrode) for the capacitive element CP both embedded in the interlayer insulating film IL2. Then, a lower surface of the wiring M2 is positioned in the middle of the thickness of the interlayer insulating film IL2. A lower surface of the electrode DE2 is in contact with the barrier insulating film B1. The barrier insulating film B1 of a portion interposed between the electrode DE1 and the electrode DE2 functions as a capacitance insulating film of the capacitive element CP and is thicker than the barrier insulating film B1 of a portion which covers the wiring M1.

One of the main features of the present embodiment resides in that the lower surface of the electrode DE2 is in contact with the barrier insulating film B1 and the barrier insulating film B1 of the portion interposed between the electrode DE1 and the electrode DE2 functions as the capacitance insulating film of the capacitive element CP.

In the present embodiment, since the barrier insulating film is used as the capacitive insulating film of the capacitive element CP, it becomes easy to form the capacitive element CP. It also becomes easy to reduce the number of the manufacturing process steps of the semiconductor device. Further, it becomes easy to increase the capacitance value of the capacitive element CP as compared with the case where the interlayer insulating film IL2 is used as the capacitance insulating film.

Another one of the main features of the present embodiment resides in that the barrier insulating film B1 of the portion interposed between the electrode DE1 and the electrode DE2 is thicker than the barrier insulating film B1 of the portion which covers the wiring M1.

Unlike the present embodiment, assume where the thickness of the barrier insulating film B1 of the portion interposed between the electrode DE1 and the electrode DE2 is the same thickness as the barrier insulating film B1 of the portion which covers the wiring M1. In this case, when the thickness of the barrier insulating film B1 is made thin, the barrier insulating film B1 which is interposed between the electrode DE1 and the electrode DE2 and functions as the capacitance insulating film also becomes thin in thickness. Consequently, the breakdown voltage (insulation breakdown voltage) between the electrode DE1 and the electrode DE2 becomes low and hence the reliability of the capacitive element CP is degraded. Further, in this case, there is a fear that when the thickness of the barrier insulating film B1 is set thick, the barrier insulating film B1 covering over the wiring M1 is made thick in thickness, thereby leading to an increase in parasitic capacitance formed between the wiring M1 and the wiring M2 higher one than the wiring M1, so that the performance of the semiconductor device is degraded. This is because since the insulating material suitable as for the barrier insulating film B1 is high in dielectric constant, the increase in the thickness of the barrier insulating film B1 over the wiring M1 will lead to an increase in the parasitic capacitance between the wiring M1 and the wiring M2. Furthermore, in this case, there is a fear that when the barrier insulating film B1 is made thick in thickness, the amount of overetching needs to be set in a large quantity upon removing the barrier insulating film B1 at the bottom of the via hole VH2 to expose the wiring M1, so that the wiring M1 is damaged.

On the other hand, in the present embodiment, the barrier insulating film B1 of the portion interposed between the electrode DE1 and the electrode DE2 is thicker than the barrier insulating film B1 of the portion which covers the wiring M1.

That is, in the present embodiment, the same film (barrier insulating film B1 herein) is used for the capacitance insulating film of the capacitive element CP and the barrier insulating film which covers the upper surface of the wiring M1. However, the thickness of the barrier insulating film B1 of the portion which covers the wiring M1, and the thickness of the barrier insulating film B1 (i.e., the barrier insulating film B1 of the portion interposed between the electrode DE1 and the electrode DE2) of the portion which functions as the capacitance insulating film are not the same. The thickness (T3) of the barrier insulating film B1 (i.e., the barrier insulating film B1 of the portion interposed between the electrode DE1 and the electrode DE2) of the portion which functions as the capacitance insulating film is thicker than the thickness (T2) of the barrier insulating film B1 of the portion which covers the wiring M1 (i.e., T3>T2).

The parasitic capacitance formed between the wiring M1 and the wiring M2 higher one than the wiring M1 can be suppressed by making thin the thickness (T2) of the barrier insulating film B1 of the portion which covers the wiring M1. Further, the thickness (T2) of the barrier insulating film B1 of the portion which covers the wiring M1 is made thin to thereby make it possible to set the amount of overetching to be small when the barrier insulating film B1 is removed at the bottom of the via hole VH2 to expose the wiring M1 (corresponding to the etching step of above FIG. 19). Further, it is possible to suppress or prevent the wiring M1 from being damaged due to the overetching.

Further, by increasing the thickness (T3) of the barrier insulating film B1 of the portion interposed between the electrode DE1 and the electrode DE2, the breakdown voltage (insulation breakdown voltage) between the electrode DE1 and the electrode DE2 can be enhanced, and the reliability of the capacitive element CP can be improved.

Thus, in the present embodiment, the barrier insulating film B1 of the portion interposed between the electrode DE1 and the electrode DE2 is made thicker in thickness than the barrier insulating film B1 of the portion covering the wiring M1 to thereby allow the suppression of the parasitic capacitance formed between the wiring M1 and the wiring M2 and the increase in the breakdown voltage (insulation breakdown voltage) between the electrode DE1 and the electrode DE2 to be made compatible. It is also possible to suppress or prevent damage of the wiring M1 when the wiring M1 is exposed at the bottom of the via hole VH2. Thus, the performance of the semiconductor device can be improved. Further, the reliability of the semiconductor device can be improved.

Also, in the present embodiment, the barrier insulating film B1 is provided to have the thin film part B1a and the thick film part B1b thicker than the thin film part B1a. The thick film part B1b of the barrier insulating film B1 is interposed between the electrode DE1 and the electrode DE2. The thin film part B1a of the barrier insulating film B1 is formed over the wiring M1. Thus, it is possible to easily and properly make the barrier insulating film B1 of the portion interposed between the electrode DE1 and the electrode DE2 thicker than the barrier insulating film B1 of the portion which covers the wiring M1.

Further, in the present embodiment, the thin film part B1a of the barrier insulating film B1 is formed over part of the electrode DE1, and the via portion of the wiring M2b (third wiring) embedded in the interlayer insulating film IL2 penetrates the thin film part B1a of the barrier insulating film B1 formed over the electrode DE1 and is coupled to the electrode DE1. Since the via portion of the wiring M2b penetrates the thin film part B1a of the barrier insulating film B1 without penetrating the thick film part B1b thereof and is coupled to the electrode DE1, the via hole VH2 for burying the via portion of the wiring M2b becomes easy to be formed, and part of the electrode DE1 can appropriately be exposed at the bottom of the via hole VH2. Thus, a failure in the coupling between the via portion of the wiring M2b and the electrode DE1 can be more properly prevented, and the manufacturing yield of the semiconductor device can be improved.

Furthermore, the manufacturing process of the semiconductor device according to the present embodiment has a step of forming the barrier insulating film B1 having the thin film part B1a and the thick film part B1b thicker than the thin film part B1a over the interlayer insulating film IL1 embedded with the wiring M1 and the electrode DE1 (refer to FIG. 12). The wiring M1 is covered with the thin film part B1a of the barrier insulating film B1, and at least part of the electrode DE1 is covered with the thick film part B1b of the barrier insulating film B1. The manufacturing process of the semiconductor device according to the present embodiment further has a step of forming each via hole VH2 (hole) and the opening OP2 for the electrode DE2 in the interlayer insulating film IL2 formed over the barrier insulating film B1. In this step, the thick film part B1b of the barrier insulating film B1 is exposed at the bottom of the opening OP2, and the thin film part B1a of the barrier insulating film B1 is exposed at the bottom of the via hole VH2 (refer to above FIG. 14). Then, the thick film part B1b of the barrier insulating film B1 is interposed between the electrode DE2 formed (embedded) in the opening OP2 and the electrode DE1. The barrier insulating film B1 of the portion interposed between the electrode DE1 and the electrode DE2 functions as the capacitance insulating film of the capacitive element CP.

In the present embodiment, the barrier insulating film B1 having the thin film part B1a and the thick film part B1b thicker than the thin film part B1a is formed over the interlayer insulating film IL1 embedded with the wiring M1 and the electrode DE1. The wiring M1 is covered with the thin film part B1a of the barrier insulating film B1, and at least part of the electrode DE1 is covered with the thick film part B1b of the barrier insulating film B1. Then, the thick film part B1b of the barrier insulating film B1 is interposed between the electrodes DE1 and DE2 of the capacitive element CP. The thick film part B1b of the barrier insulating film B1 is allowed to function as the capacitance insulating film of the capacitive element CP. Therefore, the thickness of the thin film part B1a and the thickness of the thick film part B1b are adjusted to thereby enable the thickness of the barrier insulating film B1 of the portion covering the wiring M1 and the thickness (i.e., the thickness of the barrier insulating film B1 of the portion which functions as the capacitance insulating film) of the barrier insulating film B1 of the portion interposed between the electrode DE1 and the electrode DE2 to be respectively independently controlled to a desired thickness.

Accordingly, the barrier insulating film B1 of the portion interposed between the electrode DE1 and the electrode DE2 can be made thicker in thickness than the barrier insulating film B1 of the portion which covers the wiring M1. Thus, it is possible to make compatible the suppression of the parasitic capacitance formed between the wiring M1 and the wiring M2 and the increase in the breakdown voltage between the electrode DE1 and the electrode DE2. Further, it is also possible to suppress or prevent damage of the wiring M1 when the wiring M1 is exposed at the bottom of the via hole VH2. Thus, the performance of the semiconductor device can be enhanced. Further, the reliability of the semiconductor device can be improved.

Further, in the present manufacturing process carried out, the step added upon forming the capacitive element CP within the wiring structure is a step of forming the barrier insulating film B1 having the thin film part B1a and the thick film part B1b thicker than the thin film part B1a. If the barrier insulating film B1 having the thin film part B1a and the thick film part B1b is previously formed, the capacitive element CP can also be formed together in accordance with the step of forming the wiring structure. Therefore, it is possible to suppress an increase in the manufacturing process steps of the semiconductor device with the formation of the capacitive element CP. It is thus possible to suppress the manufacturing time and cost of the semiconductor device.

Furthermore, in the present embodiment, the step of forming the barrier insulating film B1 having the thin film part B1a and the thick film part B1b thicker than the thin film part B1a specifically includes a step of forming the barrier insulating film B1 over the interlayer insulating film IL1, and a step of making partly thin the barrier insulating film B1 to thereby form the barrier insulating film B1 having the thin film part B1a and the thick film part B1b thicker than the thin film part B1a. More specifically, it includes a step of forming the barrier insulating film B1 over the interlayer insulating film IL1, a step of forming the mask layer over the barrier insulating film B1, and a step of etching the barrier insulating film B1 with the mask layer as the etching mask and making thin the thickness of the barrier insulating film B1 of the portion exposed from the mask layer to thereby form the barrier insulating film B1 having the thin film part B1a and the thick film part B1b. Incidentally, the mask layer corresponds to the photoresist pattern PR1.

Thus, it is possible to easily and appropriately form the barrier insulating film B1 having the thin film part B1a and the thick film part B1b thicker than the thin film part B1a.

Further, in the present embodiment, the thickness (i.e., the thickness T3 of the barrier insulating film B1 of the portion interposed between the electrodes DE1 and DE2) of the thick film part B1b of the portion being in contact with the lower surface of the electrode DE2, of the thick film part B1b of the barrier insulating film B1 is smaller than the thickness T1 of the thick film part B1b of the portion being not in contact with the lower surface of the electrode DE2 (i.e., T3<T1). This is because in the etching step of above FIG. 19, the thick film part B1b of the barrier insulating film B1 of the portion exposed from the opening OP2 is made thin in thickness.

Thus, the corner of the lower surface of the electrode DE2 is in a state of being covered with the barrier insulating film B1. That is, the lower surface of the electrode DE2 comes in contact with the barrier insulating film B1, and the lower part of the side surface of the electrode DE2 is also in a state of being in contact (covered) with the barrier insulating film B1. That is, the side surface of the electrode DE2 is also in a state of being in contact (covered) with the barrier insulating film B1 in the vicinity of the corner of the lower surface of the electrode DE2. In the electrode DE2, the electric field is easy to concentrate on the corner of the lower surface of the electrode DE2. When the barrier insulating film B1 and the interlayer insulating film IL2 are compared with each other, the barrier insulating film B1 is high in terms of the breakdown voltage per unit thickness. Therefore, the breakdown voltage between the electrode DE1 and the electrode DE2 can further be enhanced with the corner of the lower surface of the electrode DE2 on which the electric field is easy to concentrate being in a state of being covered with the barrier insulating film B1. Accordingly, the reliability of the semiconductor device can further be improved.

Embodiment 2

Figure 23:
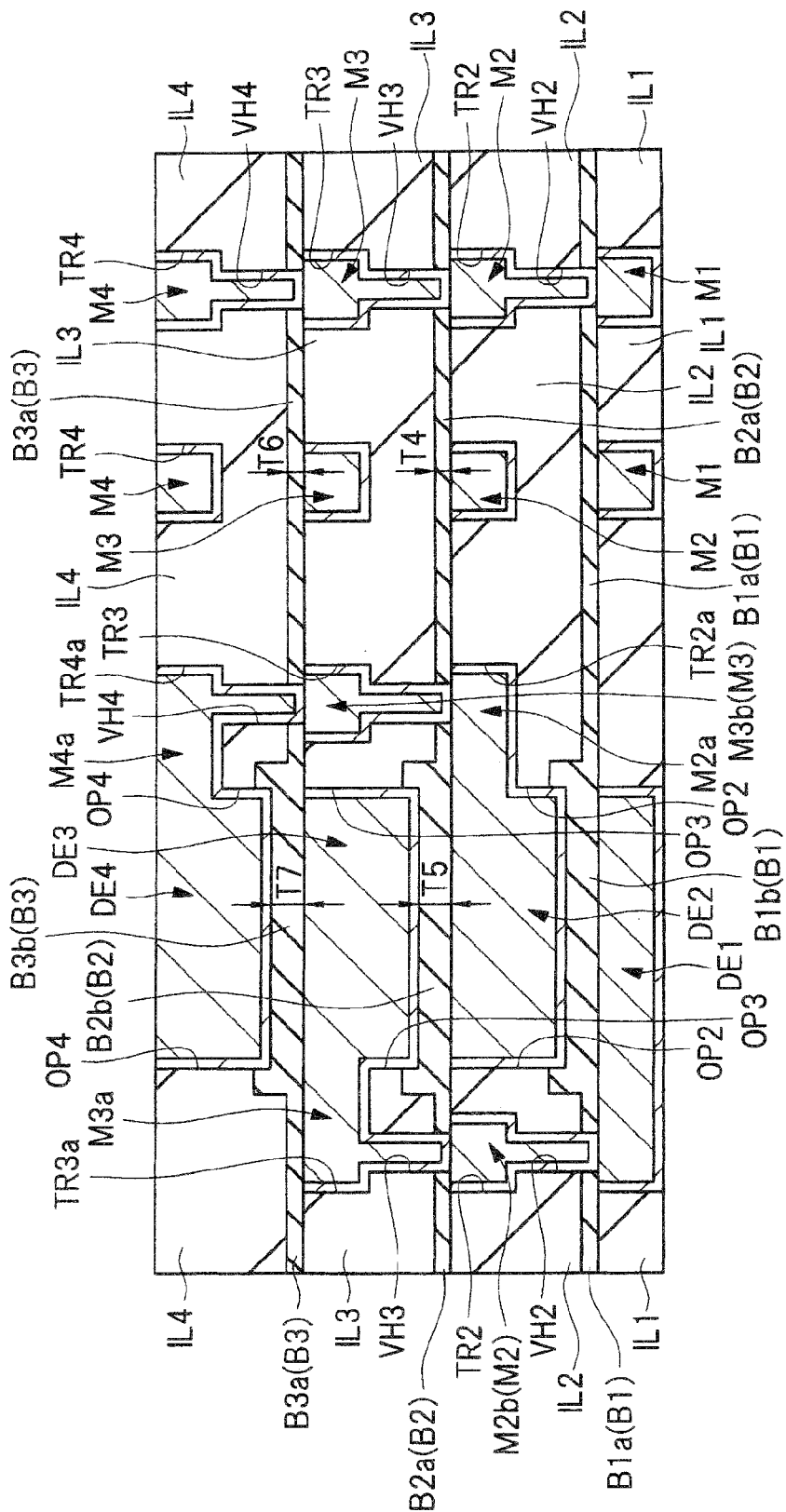
FIG. 23 is a fragmentary sectional diagram of a semiconductor device according to another embodiment.
Figure 24:
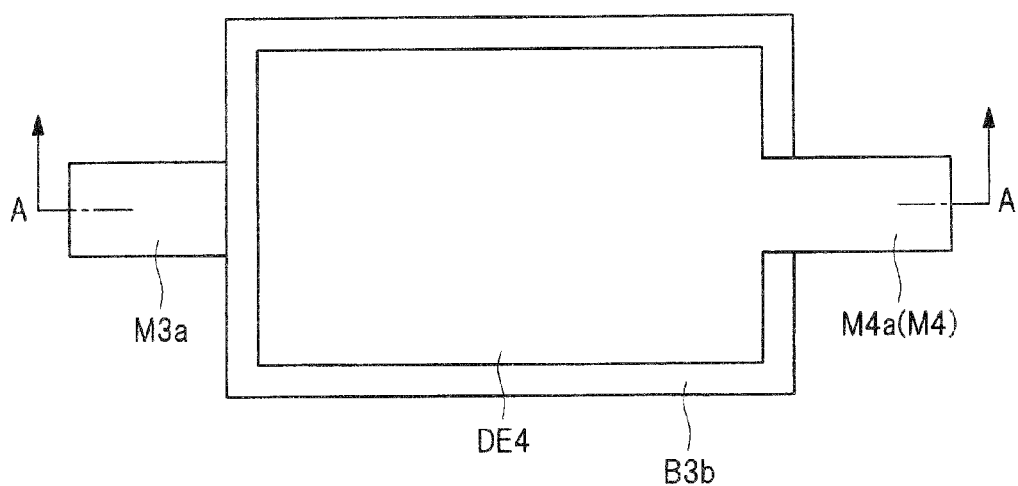
FIG. 24 is a fragmentary plan diagram of the semiconductor device according to another embodiment.

FIG. 23 is a fragmentary sectional diagram of a semiconductor device according to the present embodiment 2. FIGS. 24 to 27 are fragmentary plan diagrams of the semiconductor device according to the preset embodiment 2.

Figure 25:
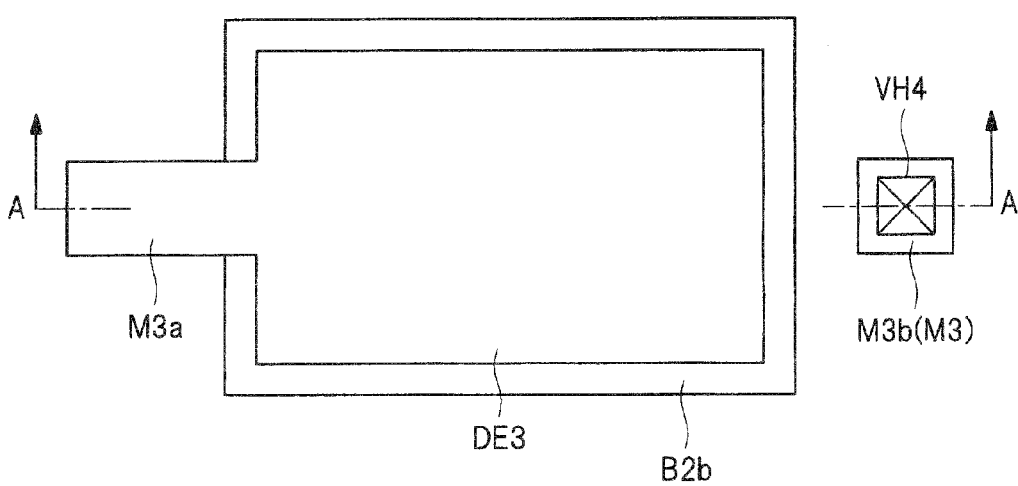
FIG. 25 is a fragmentary plan diagram of the semiconductor device according to another embodiment.
Figure 26:
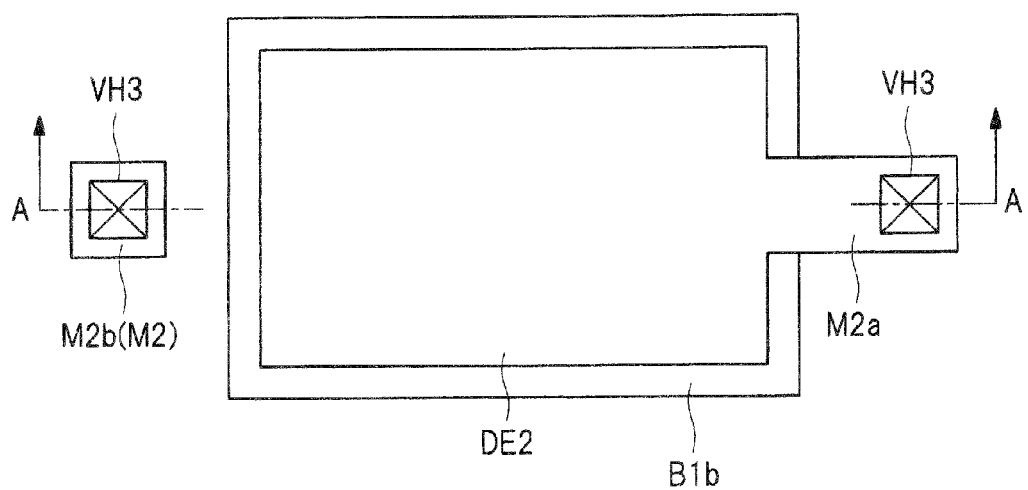
FIG. 26 is a fragmentary plan diagram of the semiconductor device according to another embodiment.
Figure 27:
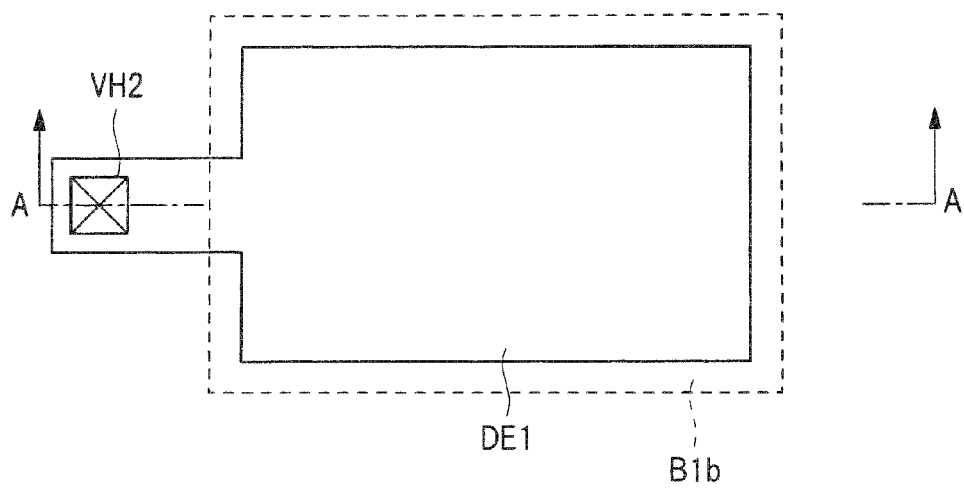
FIG. 27 is a fragmentary plan diagram of the semiconductor device according to another embodiment.

In a manner similar to above FIG. 1 showing the above embodiment 1, the illustration of a structure of a layer lower than a wiring layer formed with each wiring M1 and an electrode DE1 is omitted even in FIG. 23 for simplification of the drawing. Further, the illustration of a structure of an upper layer than an interlayer insulating film IL4 is omitted in FIG. 23 for simplification of the drawing. In addition, the same plane area (plane area in which a capacitive element CP is formed) is shown in FIGS. 24 to 27. FIG. 25 corresponds to the case where an electrode DE4 and a thick film part B3b of a barrier insulating film B3 are omitted from FIG. 24. FIG. 26 corresponds to the case where an electrode DE3, each wiring M3, and a thick film part B2b of a barrier insulating film B2 are omitted from FIG. 25. FIG. 27 corresponds to the case where an electrode DE2, each wiring M2, and a thick film part B1b of a barrier insulating film B1 are omitted from FIG. 26. Further, in FIG. 27, the thick film part B1b of the barrier insulating film B1 is indicated by a dotted line. Furthermore, an area (part on the left side of FIG. 23) in which the capacitive element of FIG. 23 is formed substantially corresponds to a cross-section at a position taken along line A-A of each of FIGS. 24 to 27.

The semiconductor device according to the present embodiment 2 is a semiconductor device in which a wiring structure (multilayer wiring structure) having a plurality of wiring layers are formed over a semiconductor substrate (corresponding to the above semiconductor substrate SB). A MIM type capacitive element is formed in the wiring structure (multilayer wiring structure). This point is similar to the above embodiment 1.

In the present embodiment 2, however, the electrodes which configure the capacitive element, are formed in three or more wiring layers. In the case of FIG. 23, the electrodes are formed in four wiring layers. That is, the wirings M1 and the electrode DE1 are formed in the wiring layer formed with the wirings M1. The wirings M2 and the electrode DE2 are formed in the wiring layer higher one than the wiring layer formed with each wiring M1. The wirings M3 and the electrode DE3 are formed in the wiring layer higher one than the wiring layer formed with the wirings M2 and the electrode DE2. Wirings M4 and an electrode DE4 are formed in the wiring layer higher one than the wiring layer formed with the wirings M3 and the electrode DE3. These electrodes DE1, DE2, DE3, and DE4 are electrodes which configure the MIM type capacitive element.

Incidentally, here, the present embodiment will be illustrated and described in the case where the electrodes DE1, DE2, DE3, and DE4 which configure the MIM type capacitive element are formed in the four wiring layers. However, the electrodes which configure the MIM type capacitive element can also be formed in three wiring layers or five or more wiring layers.

The present embodiment will hereinafter be specifically described with reference to FIGS. 23 to 27.

In the semiconductor device (wiring structure) shown in FIG. 23, the interlayer insulating film IL1, the wirings M1 and the electrode DE1 embedded in the interlayer insulating film IL1, the barrier insulating film B1 formed over the interlayer insulating film IL1 embedded with the wirings M1 and the electrode DE1, the interlayer insulating film IL2 formed over the barrier insulating film B1, and the wirings M2 and the electrode DE2 embedded in the interlayer insulating film IL2 are similar to those in the above embodiment 1. That is, the structure below the barrier insulating film B2 is basically identical to the case of FIG. 1 even in the case of FIG. 23, and its repetitive description will be omitted herein.

The barrier insulating film B3 is formed over the interlayer insulating film IL2 embedded with the wirings M2 and the electrode DE2 so as to cover the wirings M2 and the electrode DE2. An interlayer insulating film IL3 is formed over the barrier insulating film B2, and the wirings M3 and the electrode DE3 are embedded in the interlayer insulating film IL3. The barrier insulating film B3 is formed over the interlayer insulating film IL3 embedded with the wirings M3 and the electrode DE3 so as to cover the wirings M3 and the electrode DE3. The interlayer insulating film IL4 is formed over the barrier insulating film B3, and the wirings M4 and the electrode DE4 are embedded in the interlayer insulating film IL4.

A barrier insulating film (not shown) is formed over the interlayer insulating film IL4 so as to cover the wirings M4 and the electrode DE4. Further, interlayer insulating films and wirings or the like can be formed over the barrier insulating film, but their illustrations and explanations will be omitted herein.

As with the above wirings M2, the wirings M3 and M4 are also damascene wirings (damascene copper wiring, embedded copper wiring) with copper as a main constituent (main component) and are more specifically formed by the dual damascene method. The barrier insulating film B2 functions as a barrier insulating film of copper wiring (wiring M2 herein). The barrier insulating film B3 functions as a barrier insulating film of copper wiring (wiring M3 herein). A material preferable as the barrier insulating films B2 and B3 is similar to the above barrier insulating film B1. Further, a silicon oxide film or a low dielectric constant insulating film can suitably be used as the interlayer insulating films IL3 and IL4. The dielectric constant of each of the interlayer insulating films IL3 and IL4 is lower than that of each of the barrier insulating films B2 and B3.

The electrode DE3 is formed in the same process as the wiring M3 by the damascene method. Further, the electrode DE4 is formed in the same process as the wiring M4 by the damascene method. Therefore, since the electrode DE3 and the wiring M3 are formed using the same (common) conductive film, not only the wiring M3 but also the electrode DE3 is formed with copper (Cu) as main constituent (main component). Further, since the electrode DE4 and the wiring M4 are formed using the same (common) conductive film, not only the wiring M4 but also the electrode DE4 is formed with copper (Cu) as a main constituent (main component). The wirings M3 and M4 and the electrodes DE3 and DE4 are respectively formed by a main conductor film principally comprised of a barrier conductor film and copper (Cu) in a manner similar to the above wirings M1 and M2 and electrodes DE1 and DE2.

The electrode DE3 is embedded in an opening OP3 formed in the interlayer insulating film IL3. The electrode DE4 is embedded in an opening OP4 formed in the interlayer insulating film IL4. The opening OP3 penetrates the interlayer insulating film IL3, and the lower surface of the electrode DE3 is in contact with the barrier insulating film B2. The opening OP4 penetrates the interlayer insulating film IL4, and the lower surface of the electrode DE4 is in contact with the barrier insulating film B3.

The wiring M3 is embedded in a wiring trench TR3 formed in the interlayer insulating film IL3. The wiring M4 is embedded in a wiring trench TR4 formed in the interlayer insulating film IL4.

The wiring trench TR3 does not penetrate the interlayer insulating film IL3. The bottom face of the wiring trench TR3 is positioned in the middle of the thickness of the interlayer insulating film IL3. Further, the wiring trench TR4 does not penetrate the interlayer insulating film IL4. The bottom face of the wiring trench TR4 is positioned in the middle of the thickness of the interlayer insulating film IL4. Each of via holes (holes) VH3 is formed so as to be internally included in the wiring trench TR3 in plan view. The via hole VH3 penetrates the interlayer insulating film IL3 and the barrier insulating film B2. The upper surface of the wiring M2 is exposed at the bottom of the via hole VH3. Each of via holes VH4 is formed so as to be internally included in the wiring trench TR4 in plan view. The via hole VH4 penetrates the interlayer insulating film IL4 and the barrier insulating film B3. The upper surface of the wiring M3 is exposed at the bottom of the via hole VH4.

Therefore, the lower surface of the wiring M3 is located in the middle of the thickness of the interlayer insulating film IL3 except for a via portion (portion to fill in the via hole VH3) of the wiring M3. Part (part of the thickness of the interlayer insulating film IL3) of the interlayer insulating film IL3 is interposed between the lower surface of the wiring M3 and the upper surface of the barrier insulating film B2. Further, the lower surface of the wiring M4 is positioned in the middle of the thickness of the interlayer insulating film IL4 except for a via portion (portion to fill in the via hole VH4) of the wiring M4. Part (part of the thickness of the interlayer insulating film IL4) of the interlayer insulating film IL4 is interposed between the lower surface of the wiring M4 and the upper surface of the barrier insulating film B3.

The wiring M3 is electrically coupled to the wiring M2 through the via portion (portion to fill in the via hole VH3) of the wiring M3. The wiring M4 is electrically coupled to the wiring M3 through the via portion (portion to fill in the via hole VH4) of the wiring M4. The wiring M3 and the via portion of the wiring M3 are formed integrally, and the wiring M4 and the via portion of the wiring M4 are formed integrally.

The barrier insulating films B2 and B3 respectively follow the characteristics of the above barrier insulating film B1. Therefore, the configuration similar to the barrier insulating film B1 in the above embodiment 1 can be applied to the barrier insulating films B2 and B3. However, the description related to the barrier insulating film B1 in the above embodiment 1 is made as follows when the configuration is applied to the barrier insulating film B2. The interlayer insulating film IL1 is replaced with the interlayer insulating film IL2, the interlayer insulating film IL2 is replaced with the interlayer insulating film IL3, the wiring M1 is replaced with the wiring M2, the wiring M2 is replaced with the wiring M3, the electrode DE1 is replaced with the electrode DE2, the electrode DE2 is replaced with the electrode DE3, and the opening OP2 is replaced with the opening OP3. Further, the description related to the barrier insulating film B1 in the above embodiment 1 is made as follows when the configuration is applied to the barrier insulating film B3. The interlayer insulating film IL1 is replaced with the interlayer insulating film IL3, the interlayer insulating film IL2 is replaced with the interlayer insulating film IL4, the wiring M1 is replaced with the wiring M3, the wiring M2 is replaced with the wiring M4, the electrode DE1 is replaced with the electrode DE3, the electrode DE2 is replaced with the electrode DE4, and the opening OP2 is replaced with the opening OP4.

Although the main features of the barrier insulating films B2 and B3 will be described below, the configuration of the barrier insulating film B1 can be applied even to other than that.

In the present embodiment 2, the barrier insulating film B2 has a thin film part B2a and a thick film part B2b thicker than the thin film part B2a in a manner similar to the barrier insulating film B1 in the above embodiment 1. Further, the barrier insulating film B3 has a thin film part B3a and a thick film part B3b thicker than the thin film part B3a. Then, the thick film part B2b of the barrier insulating film B2 is interposed between the electrode DE2 and the electrode DE3. The thick film part B3b of the barrier insulating film B3 is interposed between the electrode DE3 and the electrode DE4. On the other hand, the thin film part B2a of the barrier insulating film B2 is formed over the wiring M2, and the thick film part B3a of the barrier insulating film B3 is formed over the wiring M3.

The opening OP3 and the electrode DE3 embedded in the opening OP3 are internally included in the thick film part B2b of the barrier insulating film B2 in plan view. Further, the opening OP4 and the electrode DE4 embedded in the opening OP4 are internally included in the thick film part B3b of the barrier insulating film B3 in plan view.

The lower surface of the electrode DE3 comes in contact with the thick film part B2b of the barrier insulating film B2, and the lower surface of the electrode DE4 comes in contact with the thick film part B3b of the barrier insulating film B3. The thickness (i.e., the thickness of the barrier insulating film B2 of a portion interposed between the electrode DE2 and the electrode DE3) of the thick film part B2b of a portion being in contact with the electrode DE3, of the thick film part B2b of the barrier insulating film B2 is smaller than the thickness of the thick film part B2b of a portion being not in contact with the electrode DE3. Further, the thickness (i.e., the thickness of the barrier insulating film B3 of a portion interposed between the electrode DE3 and the electrode DE4) of the thick film part B3b of a portion being in contact with the electrode DE4, of the thick film part B3b of the barrier insulating film B3 is smaller than the thickness of the thick film part B3b of a portion being not in contact with the electrode DE4. Therefore, the corner of the lower surface of the electrode DE4 is covered with the barrier insulating film B2, and the corner of the lower surface of the electrode DE4 is covered with the barrier insulating film B3.

Thus, the electrode DE2 and the electrode DE3 have portions opposite to each other through the thick film part B2b of the barrier insulating film B2 interposed therebetween without interposing the interlayer insulating film IL3 therebetween. That is, the electrode DE2 and the electrode DE3 are superimposed on each other with the thick film part B2b of the barrier insulating film B2 interposed therebetween in plan view.

The barrier insulating film B2 of the portion interposed between the electrode DE2 and the electrode DE3 functions as a capacitance insulating film of the capacitive element and is thicker than the barrier insulating film B2 of the portion which covers the wiring M2. Further, the barrier insulating film B3 of the portion interposed between the electrode DE3 and the electrode DE4 functions as a capacitance insulating film of the capacitance element and is thicker than the barrier insulating film B3 of the portion which covers the wiring M3.

That is, the thickness (film thickness) T5 of the barrier insulating film B2 of the portion interposed between the electrode DE2 and the electrode DE3 is larger than the thickness T4 of the barrier insulating film B2 of the portion which covers the wiring M2 (T5>T4). Further, the thickness (film thickness) T7 of the barrier insulating film B3 of the portion interposed between the electrode DE3 and the electrode DE4 is larger than the thickness T6 of the barrier insulating film B3 of the portion which covers the wiring M3 (T7>T6).

The MIM type capacitive element is formed by the electrodes DE1, DE2, DE3, and DE4, and the barrier insulating films B1, B2, and B3 (more particularly, the thick film parts B1b, B2b, and B3b) among the electrodes DE1, DE2, DE3, and DE4. The barrier insulating films B1, B2, and B3 (more particularly, the thick film parts B1b, B2b, and B3b) among the electrodes DE1, DE2, DE3, and DE4 can function as the capacitance insulating film of the MIM type capacitive element.

Incidentally, the electrode DE1 and the electrode DE3 are electrically coupled to each other to configure one electrode of the MIM type capacitive element. The electrode DE2 and the electrode DE4 are electrically coupled to each other to configure the other electrode of the MIM type capacitive element. In the case of FIG. 23, the via portion of the wiring M3a formed integrally with the electrode DE3 is coupled to the wiring M2b. The via portion of the wiring M2b is coupled to the electrode DE1. The electrode DE3 and the electrode DE1 are electrically coupled to each other through these wirings M3a and M2b. Further, the via portion of the wiring M4a formed integrally with the electrode DE4 is coupled to the wiring M3b. The via portion of the wiring M3b is coupled to the wiring M2a formed integrally with the electrode DE2. The electrode DE4 and the electrode DE2 are electrically coupled to each other through these wirings M4a and M3b.

Since a wiring trench TR2a embedded with the wiring M2a is coupled to the opening OP2, the electrode DE2 embedded in the opening OP2, and the wiring M2a embedded in the wiring trench TR2a are formed integrally in the same process. Further, since a wiring trench TR3a embedded with the wiring M3a is coupled to the opening OP3, the electrode DE3 embedded in the opening OP3, and the wiring M3a embedded in the wiring trench TR3a are formed integrally in the same process. Furthermore, since a wiring trench TR4a embedded with the wiring M4a is coupled to the opening OP4, the electrode DE2 embedded in the opening OP4, and the wiring M4a embedded in the wiring trench TR4a are formed integrally in the same process.

The manufacturing process of the semiconductor device according to the present embodiment 2 will next be described with reference to FIGS. 28 to 39.

Since the manufacturing process of the present embodiment 2 is also similar to that of the embodiment 1 until the above structure of FIG. 21 is obtained, its repetitive description will be omitted herein.

Figure 28:
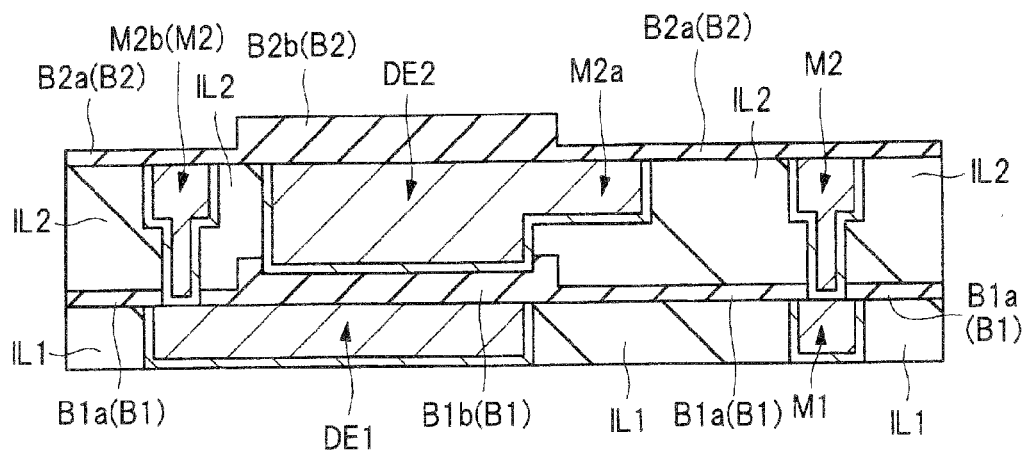
FIG. 28 is a fragmentary sectional diagram in a manufacturing process of the semiconductor device according to another embodiment.

After the above structure of FIG. 21 is obtained as with the embodiment 1, a barrier insulating film B2 having a thin film part B2a and a thick film part B2b thicker than the thin film part B2a is formed over the interlayer insulating film IL2 embedded with the electrode DE2 and the wirings M2, so as to cover the electrode DE2 and the wirings M2 as shown in FIG. 28.

Since a method of forming the barrier insulating film B2 having the thin film part B2a and the thick film part B2b thicker than the thin film part B2a is basically identical to the method (method descried with reference to FIGS. 10 to 12) of forming the barrier insulating film B1 having the thin film part B1a and the thick film part B1b thicker than the thin film part B1a in the embodiment 1, its repetitive description will be omitted herein.

Figure 29:
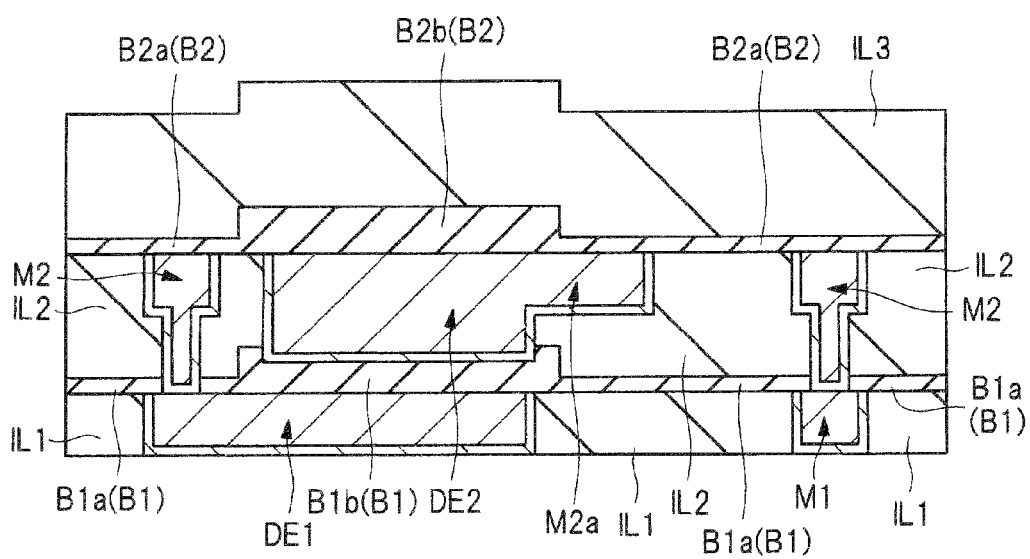
FIG. 29 is a fragmentary sectional diagram in the manufacturing process of the semiconductor device, following FIG. 28.

Next, as shown in FIG. 29, an interlayer insulating film IL3 similar to the interlayer insulating film IL2 is formed over the barrier insulating film B2 having the thin film part B2a and the thick film part B2b by a similar method.

Figure 30:
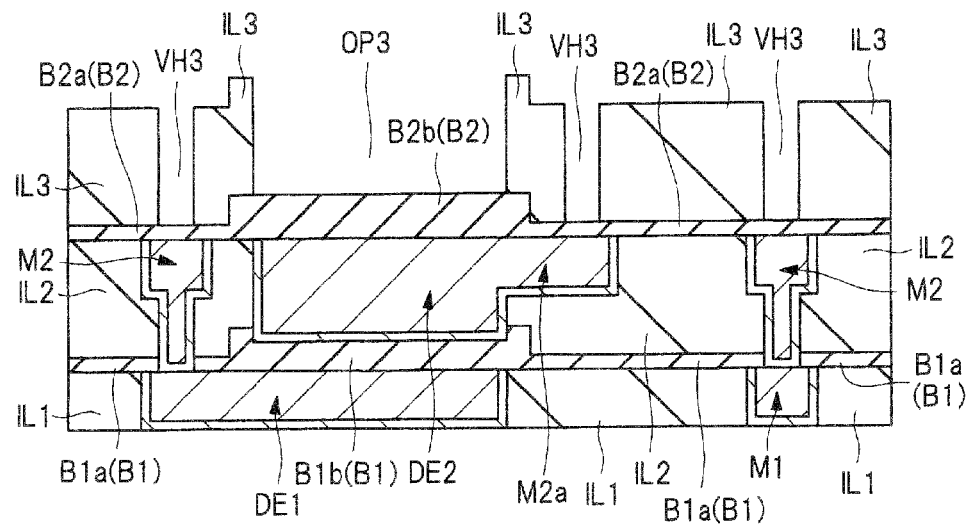
FIG. 30 is a fragmentary sectional diagram in the manufacturing process of the semiconductor device, following FIG. 29.

Next, as shown in FIG. 30, via holes VH3 and an opening OP3 are formed in the interlayer insulating film IL3. Since a method of forming the via holes VH3 and the opening OP3 is basically identical to the method (method described with reference to FIGS. 13 to 15) of forming the via holes VH2 and the opening OP2 in the interlayer insulating film IL2 in the embodiment 1, its repetitive description will be omitted herein.

The via holes VH3 and the opening OP3 are formed in the same process. Both of them penetrate the interlayer insulating film IL3 to expose the barrier insulating film B2 at the bottoms thereof. However, the thin film part B2a of the barrier insulating film B2 is exposed at the bottom of each via hole VH3, and the thick film part B2b of the barrier insulating film B2 is exposed at the bottom of the opening OP3. Since the opening OP3 is formed so as to be internally included in the thick film part B2b of the barrier insulating film B2 in plan view, the thin film part B2a of the barrier insulating film B2 is not exposed at the bottom of the opening OP3, and the thick film part B2b of the barrier insulating film B2 is exposed at the bottom thereof. On the other hand, since each via hole VH3 is formed over the thin film part B2a of the barrier insulating film B2, the thick film part B2b of the barrier insulating film B2 is not exposed at the bottom of the via hole VH3, and the thin film part B2a of the barrier insulating film B2 is exposed at the bottom thereof.

Figure 31:
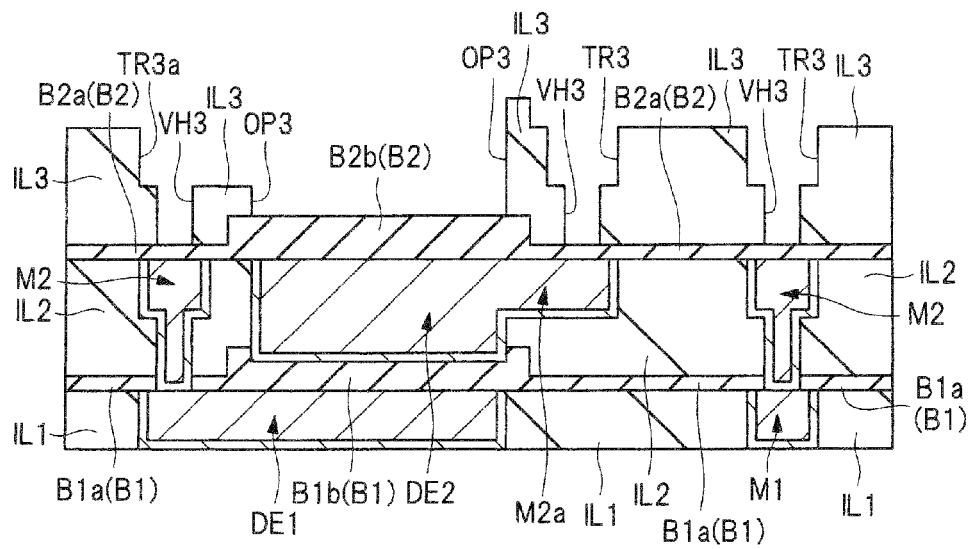
FIG. 31 is a fragmentary sectional diagram in the manufacturing process of the semiconductor device, following FIG. 30.

Next, as shown in FIG. 31, each wiring trench TR3 is formed in the interlayer insulating film IL3. Since a method of forming the wiring trench TR3 is basically identical to the method (method described with reference to FIGS. 16 to 18) of forming each wiring trench TR2 in the interlayer insulating film IL2 in the embodiment 1, its repetitive description will be omitted herein.

Figure 32:
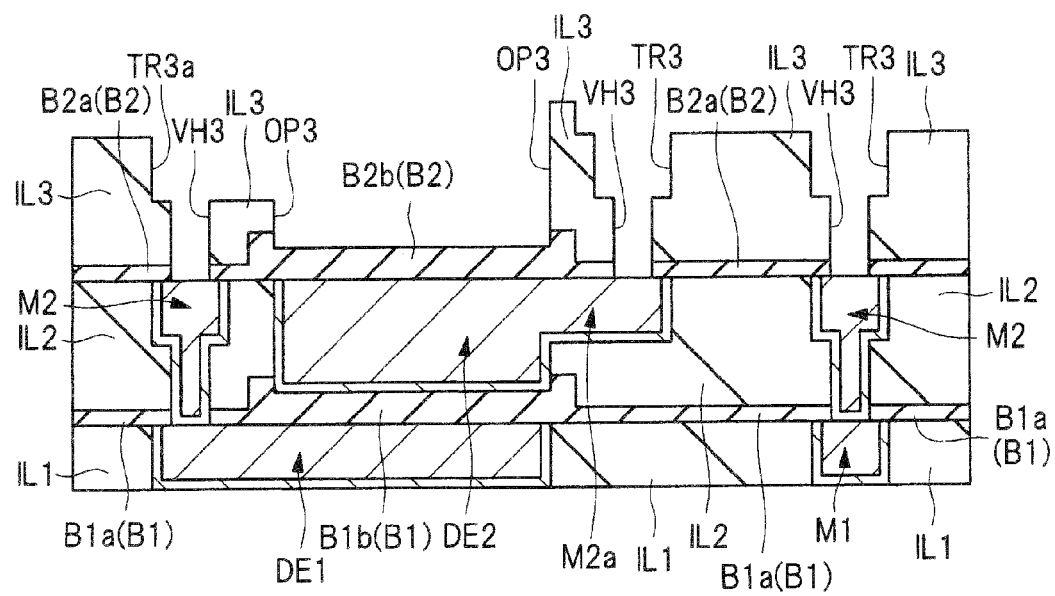
FIG. 32 is a fragmentary sectional diagram in the manufacturing process of the semiconductor device, following FIG. 31.

Next, as shown in FIG. 32, the barrier insulating film B2 of the portion exposed from the bottom of each via hole VH3 is removed by etching. Thus, the upper surface of the wiring M2 is exposed at the bottom of the via hole VH3. Upon this etching, the thick film part B2b of the barrier insulating film B2 exposed from the opening OP3 is also etched so that its thickness is made thin. Incidentally, this etching (etching step) will be referred to as an etching step of FIG. 32 subsequently for simplification.

In the stage at which the etching step of FIG. 32 is finished, the thickness of the thick film part B2b of the barrier insulating film B2 of the portion exposed at the bottom of the opening OP3 is preferably thicker than the thickness of the thin film part B2a of the barrier insulating film B2. Therefore, the thickness of the thick film part B2b of the barrier insulating film B2 at the time that the barrier insulating film B2 is formed in above FIG. 28 may be set considering that the thick film part B2b of the barrier insulating film B2 of the portion exposed at the bottom of the opening OP3 becomes thin in the etching step of FIG. 32.

Figure 33:
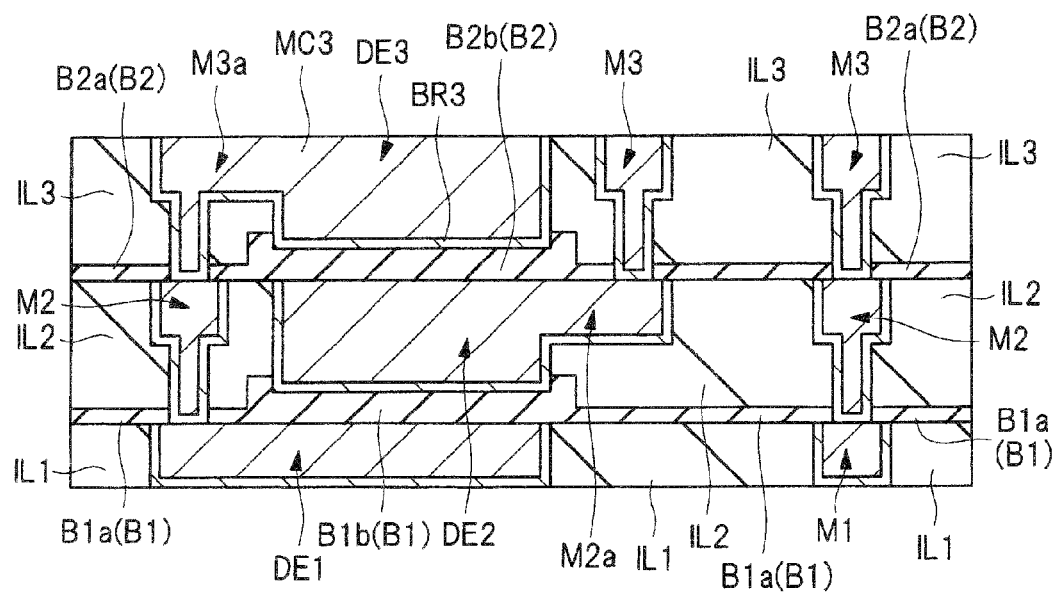
FIG. 33 is a fragmentary sectional diagram in the manufacturing process of the semiconductor device, following FIG. 32.

Next, as shown in FIG. 33, wirings M3 and an electrode DE3 are formed by the damascene method (dual damascene method herein). Since a method of forming each wiring M3 and the electrode DE3 is basically identical to the method (method described with reference to FIGS. 20 and 21) of forming the wirings M2 and the electrode DE2 in the embodiment 1, its repetitive description will be omitted herein.

The electrode DE3 is comprised of a main conductor film MC3 and a barrier conductor film BR3 embedded in the opening OP3. The wiring M3 is comprised of the main conductor film MC3 and the barrier conductor film BR3 embedded in the wiring trench TR3. A via portion of the wiring M3 is comprised of the main conductor film MC3 and the barrier conductor film BR3 embedded in the via hole VH3. The main conductor film MC3 is a film similar to the main conductor film MC2. The barrier conductor film BR3 is a film similar to the barrier conductor film BR2. When the wirings M3 and the electrode DE3 are formed, the upper surface of the interlayer insulating film IL3 is exposed, and the upper surface of the interlayer insulating film IL3, the upper surface of the electrode DE3, and the upper surface of the wiring M3 respectively form a substantially flat surface. Incidentally, since a wiring trench TR3a is coupled to the opening OP3, a wiring M3a embedded in the wiring trench TR3a, of the wiring M3 is formed integrally with the electrode DE3. Each wiring M3 other than the wiring M3a is formed away from the electrode DE3.

Figure 34:
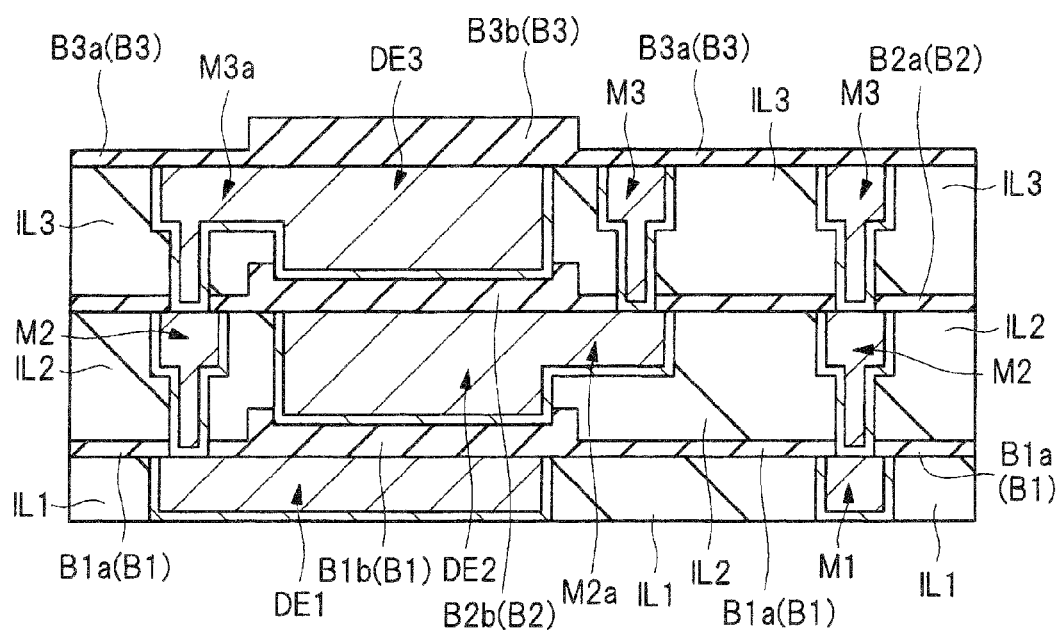
FIG. 34 is a fragmentary sectional diagram in the manufacturing process of the semiconductor device, following FIG. 33.

Next, as shown in FIG. 34, a barrier insulating film B3 having a thin film part B3a and a thick film part B3b thicker than the thin film part B3a is formed over the interlayer insulating film IL3 embedded with the electrode DE3 and each wiring M3, so as to cover the electrode DE3 and each wiring M3.

Since a method of forming the barrier insulating film B3 having the thin film part B3a and the thick film part B3b thicker than the thin film part B3a is basically identical to the method (method described with reference to FIGS. 10 to 12) of forming the barrier insulating film B1 having the thin film part B1a and the thick film part B1b thicker than the thin film part B1a in the embodiment 1, its repetitive description will be omitted herein.

Figure 35:
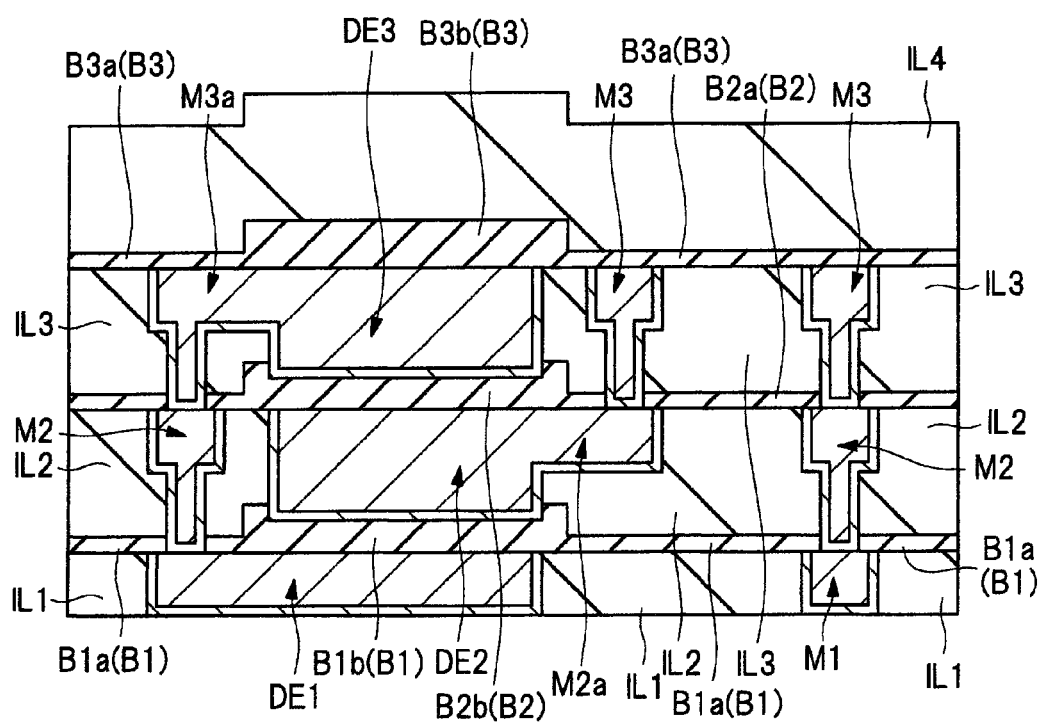
FIG. 35 is a fragmentary sectional diagram in the manufacturing process of the semiconductor device, following FIG. 34.

Next, as shown in FIG. 35, an interlayer insulating film IL4 similar to the interlayer insulating film IL2 is formed over the barrier insulating film B3 having the thin film part B3a and the thick film part B3b by a similar method.

Figure 36:
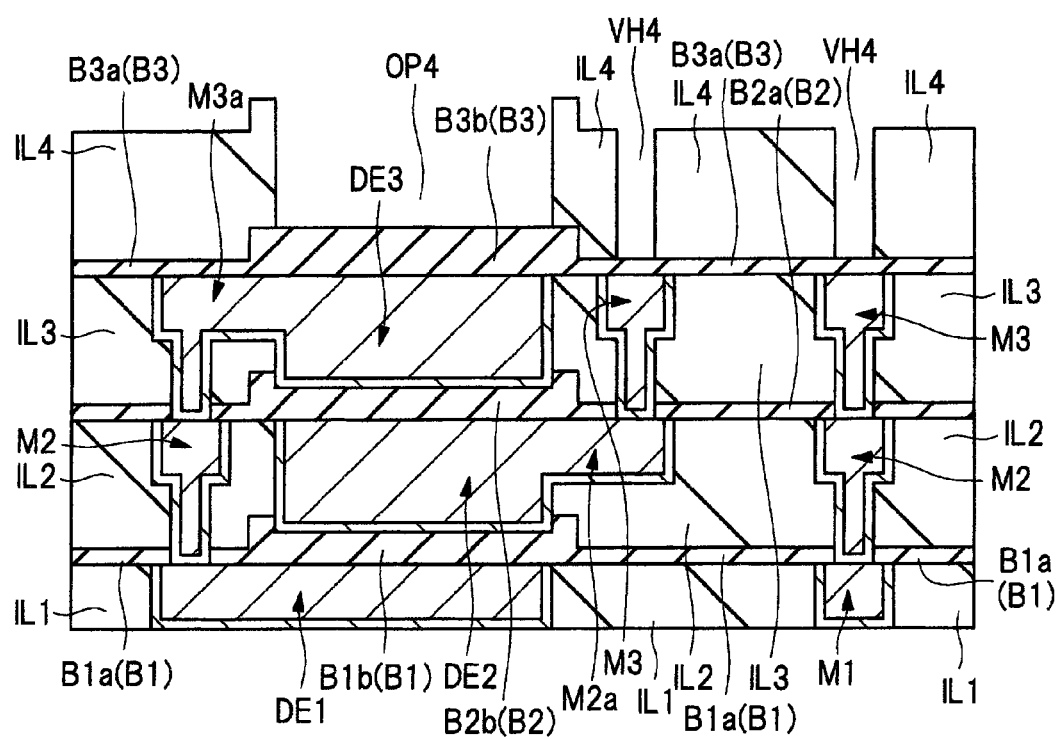
FIG. 36 is a fragmentary sectional diagram in the manufacturing process of the semiconductor device, following FIG. 35.

Next, as shown in FIG. 36, via holes VH4 and an opening OP4 are formed in the interlayer insulating film IL4. Since a method of forming the via holes VH4 and the opening OP4 is basically identical to the method (method described with reference to FIGS. 13 to 15) of forming the via holes VH2 and the opening OP2 in the interlayer insulating film IL2 in the embodiment 1, its repetitive description will be omitted herein.

The via holes VH4 and the opening OP4 are formed in the same process. Both of them penetrate the interlayer insulating film IL4 to expose the barrier insulating film B3 at the bottoms thereof. However, the thin film part B3a of the barrier insulating film B3 is exposed at the bottom of each via hole VH4, and the thick film part B3b of the barrier insulating film B3 is exposed at the bottom of the opening OP4. Since the opening OP4 is formed so as to be internally included in the thick film part B3b of the barrier insulating film B3 in plan view, the thin film part B3a of the barrier insulating film B3 is not exposed at the bottom of the opening OP4, and the thick film part B3b of the barrier insulating film B3 is exposed at the bottom thereof. On the other hand, since each via hole VH4 is formed over the thin film part B3a of the barrier insulating film B3, the thick film part B3b of the barrier insulating film B3 is not exposed at the bottom of the via hole VH4, and the thin film part B3a of the barrier insulating film B3 is exposed at the bottom thereof.

Figure 37:
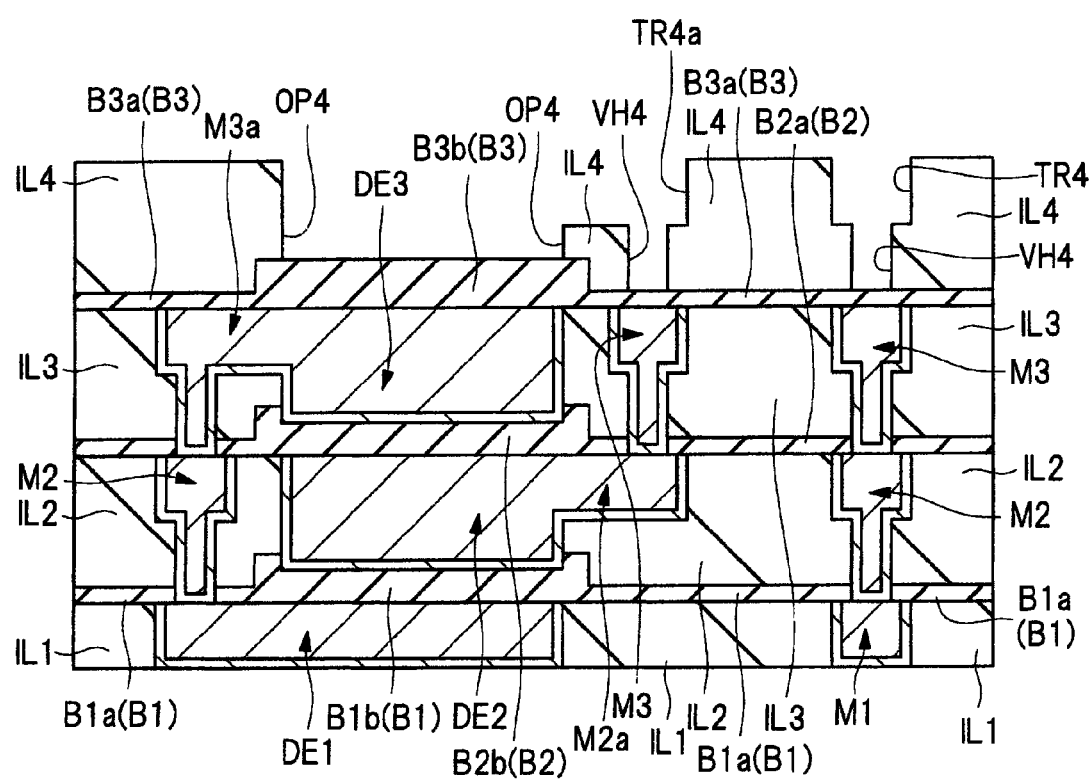
FIG. 37 is a fragmentary sectional diagram in the manufacturing process of the semiconductor device, following FIG. 36.

Next, as shown in FIG. 37, each wiring trench TR4 is formed in the interlayer insulating film IL4. Since a method of forming the wiring trench TR4 is basically identical to the method (method described with reference to FIGS. 16 to 18) of forming each wiring trench TR3 in the interlayer insulating film IL3 in the embodiment 1, its repetitive description will be omitted herein.

Figure 38:
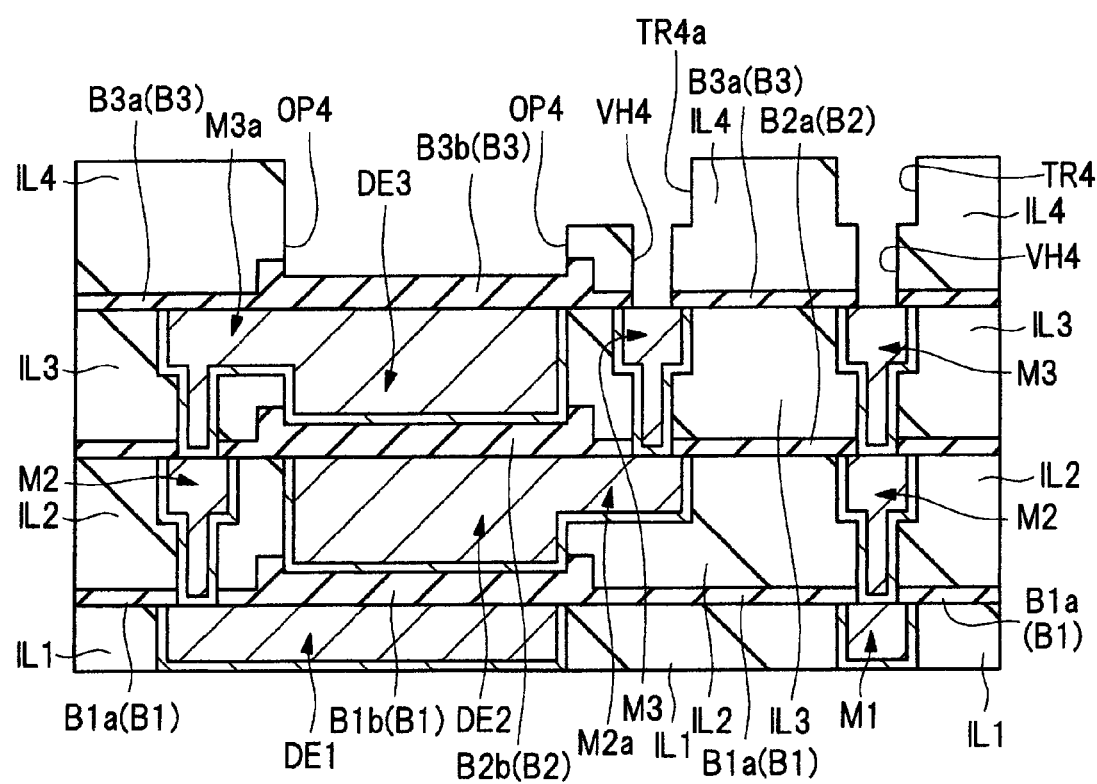
FIG. 38 is a fragmentary sectional diagram in the manufacturing process of the semiconductor device, following FIG. 37.

Next, as shown in FIG. 38, the barrier insulating film B3 of the portion exposed from the bottom of each via hole VH4 is removed by etching. Thus, the upper surface of the wiring M3 is exposed at the bottom of the via hole VH4. Upon this etching, the thick film part B3b of the barrier insulating film B3 exposed from the opening OP4 is also etched so that its thickness is made thin. Incidentally, this etching (etching step) will be referred to as an etching step of FIG. 38 subsequently for simplification.

In the stage at which the etching step of FIG. 38 is finished, the thickness of the thick film part B3b of the barrier insulating film B3 of the portion exposed at the bottom of the opening OP4 is preferably thicker than the thickness of the thin film part B3a of the barrier insulating film B3. Therefore, the thickness of the thick film part B3b of the barrier insulating film B3 at the time that the barrier insulating film B3 is formed in above FIG. 34 may be set considering that the thick film part B3b of the barrier insulating film B3 of the portion exposed at the bottom of the opening OP4 becomes thin in the etching step of FIG. 38.

Figure 39:
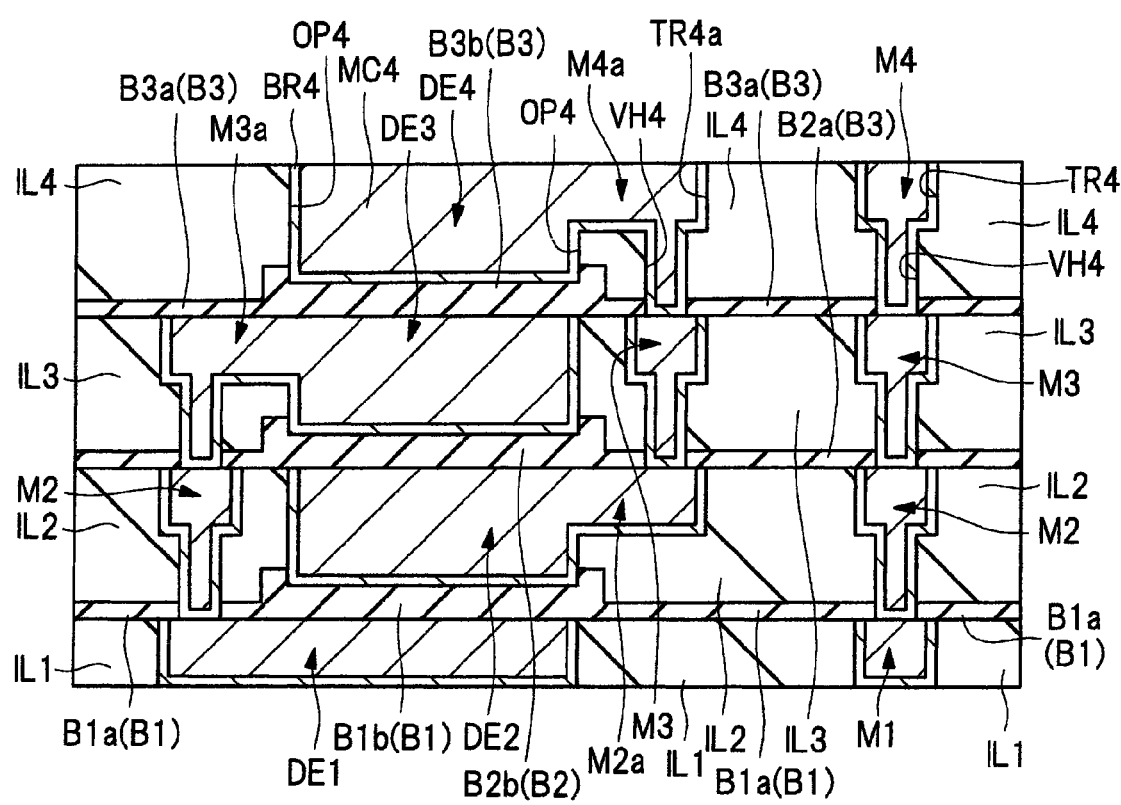
FIG. 39 is a fragmentary sectional diagram in the manufacturing process of the semiconductor device, following FIG. 38.

Next, as shown in FIG. 39, wirings M4 and an electrode DE4 are formed by the damascene method (dual damascene method herein). Since a method of forming each wiring M4 and the electrode DE4 is basically identical to the method (method described with reference to FIGS. 20 and 21) of forming the wirings M2 and the electrode DE2 in the embodiment 1, its repetitive description will be omitted herein.

The electrode DE4 is comprised of a main conductor film MC4 and a barrier conductor film BR4 embedded in the opening OP4. The wiring M4 is comprised of the main conductor film MC4 and the barrier conductor film BR4 embedded in the wiring trench TR4. A via portion of the wiring M4 is comprised of the main conductor film MC4 and the barrier conductor film BR4 embedded in the via hole VH4. The main conductor film MC4 is a film similar to the main conductor film MC2. The barrier conductor film BR4 is a film similar to the barrier conductor film BR2. When the wirings M4 and the electrode DE4 are formed, the upper surface of the interlayer insulating film IL4 is exposed, and the upper surface of the interlayer insulating film IL4, the upper surface of the electrode DE4, and the upper surface of the wiring M4 respectively form a substantially flat surface. Incidentally, since a wiring trench TR4a is coupled to the opening OP4, a wiring M4a embedded in the wiring trench TR4a, of the wiring M4 is formed integrally with the electrode DE4. Each wiring M4 other than the wiring M4a is formed away from the electrode DE4.

Thereafter, a barrier insulating film (not shown) is formed over the interlayer insulating film IL4 embedded with the electrode DE4 and the wiring M4, so as to cover the electrode DE4 and the wiring M4. Further, interlayer insulating films and wirings or the like can be formed over the barrier insulating film, but the illustrations and explanations thereof will be omitted herein.

In the present embodiment 2, the steps of above FIGS. 10 to 21 are repeated to form the MIM type capacitive element. Thus, the electrodes (the electrodes DE1, DE2, DE3, and DE4 of four layers herein) of three or more layers can be laminated on each other through the thick film parts (B1b, B2b, and B3b) of the barrier insulating films (B1, B2, and B3).

Therefore, the thickness of the thin film part B1a and the thickness of the thick film part B1b in the barrier insulating film B1 formed in FIGS. 10 to 13 are adjusted to thereby enable the thickness of the barrier insulating film B1 of the portion covering the wiring M1 and the thickness of the barrier insulating film B1 of the portion interposed between the electrode DE1 and the electrode DE2 to be respectively independently controlled to a desired thickness. Further, the thickness of the thin film part B2a and the thickness of the thick film part B2b in the barrier insulating film B2 formed in FIG. 28 are adjusted to thereby enable the thickness of the barrier insulating film B2 of the portion covering each wiring M2 and the thickness of the barrier insulating film B2 of the portion interposed between the electrode DE2 and the electrode DE3 to be respectively independently controlled to a desired thickness. Furthermore, the thickness of the thin film part B3a and the thickness of the thick film part B3b in the barrier insulating film B3 formed in FIG. 34 are adjusted to thereby enable the thickness of the barrier insulating film B3 of the portion covering each wiring M3 and the thickness of the barrier insulating film B3 of the portion interposed between the electrode DE3 and the electrode DE4 to be respectively independently controlled to a desired thickness.

Accordingly, the barrier insulating film B1 of the portion interposed between the electrode DE1 and the electrode DE2 can be made thicker than the barrier insulating film B1 of the portion which covers the wiring M1. Further, the barrier insulating film B2 of the portion interposed between the electrode DE2 and the electrode DE3 can be made thicker than the barrier insulating film B2 of the portion which covers each wiring M2. Furthermore, the barrier insulating film B3 interposed between the electrode DE3 and the electrode DE4 can be made thicker than the barrier insulating film B3 of the portion which covers each wiring M3.

Thus, it is possible to make compatible the suppression of a parasitic capacitance formed between the wiring M1 and the wiring M2 and an increase in the breakdown voltage (insulation breakdown voltage) between the electrode DE1 and the electrode DE2. It is also possible to suppress or prevent damage of the wiring M1 when the wiring M1 is exposed at the bottom of the via hole VH2. Further, it is possible to make compatible the suppression of a parasitic capacitance formed between the wiring M2 and the wiring M3 and an increase in the breakdown voltage (insulation breakdown voltage) between the electrode DE2 and the electrode DE3. It is also possible to suppress or prevent damage of the wiring M2 when the wiring M2 is exposed at the bottom of the via hole VH3. Furthermore, it is possible to make compatible the suppression of a parasitic capacitance formed between the wiring M3 and the wiring M4 and an increase in the breakdown voltage (insulation breakdown voltage) between the electrode DE3 and the electrode DE4. It is also possible to suppress or prevent damage of the wiring M3 when the wiring M3 is exposed at the bottom of the via hole VH4. Thus, the performance of the semiconductor device can be improved. Further, the reliability of the semiconductor device can be improved.

Further, in the present manufacturing process carried out, the steps added upon forming the MIM type capacitive element within the wiring structure are a step of forming the barrier insulating film B1 having the thin film part B1a and the thick film part B1b, a step of forming the barrier insulating film B2 having the thin film part B2a and the thick film part B2b, and a step of forming the barrier insulating film B3 having the thin film part B3a and the thick film part B3b. If the barrier insulating film B1 having the thin film part B1a and the thick film part B1b is formed, the barrier insulating film B2 having the thin film part B2a and the thick film part B2b is formed, and the barrier insulating film B3 having the thin film part B3a and the thick film part B3b is formed, the capacitive element CP can also be formed together in accordance with the step of forming the wiring structure. Therefore, it is possible to suppress an increase in the manufacturing process steps of the semiconductor device with the formation of the capacitive element CP. It is thus possible to suppress the manufacturing time and cost of the semiconductor device.

Although the invention made above by the present inventors has been described specifically on the basis of the preferred embodiments, the present invention is not limited to the embodiments referred to above. It is needless to say that various changes can be made thereto within the scope not departing from the gist thereof.

What is claimed is:

1. A semiconductor device, comprising:
a semiconductor substrate;
a wiring structure formed over the semiconductor substrate and including a plurality of wiring layers; and
a capacitive element formed in the wiring structure,
the wiring structure including:
  a first interlayer insulating film;
  a first wiring, and a first electrode for the capacitive element both being embedded in the first interlayer insulating film;
  a barrier insulating film formed over the first interlayer insulating film so as to cover the first wiring and the first electrode;
  a second interlayer insulating film formed over the barrier insulating film; and
  a second wiring, and a second electrode for the capacitive element both being embedded in the second interlayer insulating film,
  the second wiring having a lower surface positioned in the middle of a thickness of the second interlayer insulating film,
  the second electrode having a lower surface being in contact with the barrier insulating film, and
  the barrier insulating film of a portion interposed between the first electrode and the second electrode functioning as a capacitance insulating film of the capacitive element and being thicker than the barrier insulating film of a portion covering the first wiring.

2. The semiconductor device according to claim 1, wherein the first wiring and the second wiring are both damascene wirings each principally comprised of copper.

3. The semiconductor device according to claim 2, wherein the dielectric constant of the barrier insulating film is higher than the dielectric constant of the second interlayer insulating film.

4. The semiconductor device according to claim 1, wherein the barrier insulating film is comprised of a silicon nitride film, a silicon carbide film or a silicon carbonitride film.

5. The semiconductor device according to claim 3, wherein the second interlayer insulting film is a silicon oxide film or a low dielectric constant insulating film.

6. The semiconductor device according to claim 1, wherein the first electrode is formed in the same process as the first wiring, and
wherein the second electrode is formed in the same process as the second wiring.

7. The semiconductor device according to claim 1, wherein the second wiring is a dual damascene wiring.

8. The semiconductor device according to claim 1, wherein the barrier insulating film has a thin film part and a thick film part thicker than the thin film part,
wherein the thick film part of the barrier insulating film is interposed between the first electrode and the second electrode, and
wherein the thin film of the barrier insulating film is formed over the first wiring.

9. The semiconductor device according to claim 8, further comprising a third wiring embedded in the second interlayer insulating film and electrically coupled to the first electrode,
wherein the thin film part of the barrier insulating film is formed over a part of the first electrode, and
wherein a via portion of the third wiring penetrates the thin film part of the barrier insulating film formed over the first electrode and is coupled to the first electrode.

* * * * *